(12) United States Patent
More

(10) Patent No.: US 12,183,790 B2
(45) Date of Patent: *Dec. 31, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventor: Shahaji B. More, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/229,465

(22) Filed: Aug. 2, 2023

(65) Prior Publication Data

US 2023/0378269 A1 Nov. 23, 2023

Related U.S. Application Data

(63) Continuation of application No. 17/206,018, filed on Mar. 18, 2021, now Pat. No. 11,830,912.

(51) Int. Cl.
*H01L 29/08* (2006.01)
*H01L 29/423* (2006.01)
*H01L 29/66* (2006.01)
*H01L 29/786* (2006.01)

(52) U.S. Cl.
CPC .... *H01L 29/0847* (2013.01); *H01L 29/42392* (2013.01); *H01L 29/66545* (2013.01); *H01L 29/78696* (2013.01)

(58) Field of Classification Search
CPC ........... H01L 29/0847; H01L 29/42392; H01L 29/66545; H01L 29/78696; H01L 21/22; H01L 29/0673; H01L 29/66439; H01L 29/161; H01L 29/165; H01L 29/6653; H01L 29/7848; H01L 29/775; H01L 27/0886; H01L 21/823418; H01L 21/823431; B82Y 10/00
USPC ........................................................ 257/401
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |

(Continued)

*Primary Examiner* — Tong-Ho Kim
(74) *Attorney, Agent, or Firm* — NZ CARR LAW OFFICE

(57) ABSTRACT

A semiconductor device structure, along with methods of forming such, are described. The structure includes a source/drain epitaxial feature having a first semiconductor material, a first semiconductor layer having a first doped region and a first undoped region adjacent the first doped region, and the first doped region is in contact with the first semiconductor material. The structure further includes a second semiconductor layer disposed over the first semiconductor layer, and the second semiconductor layer includes a second doped region and a second undoped region adjacent the second doped region. The second doped region is in contact with the first semiconductor material. The structure further includes a gate electrode layer surrounding at least the first undoped region and the second undoped region.

20 Claims, 31 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,830,912 B2 * | 11/2023 | More | H01L 29/42392 |
| 2019/0189769 A1 | 6/2019 | Basker et al. | |
| 2020/0365586 A1 * | 11/2020 | Shin | H01L 27/0886 |
| 2021/0126135 A1 * | 4/2021 | Lee | H01L 29/66545 |

* cited by examiner

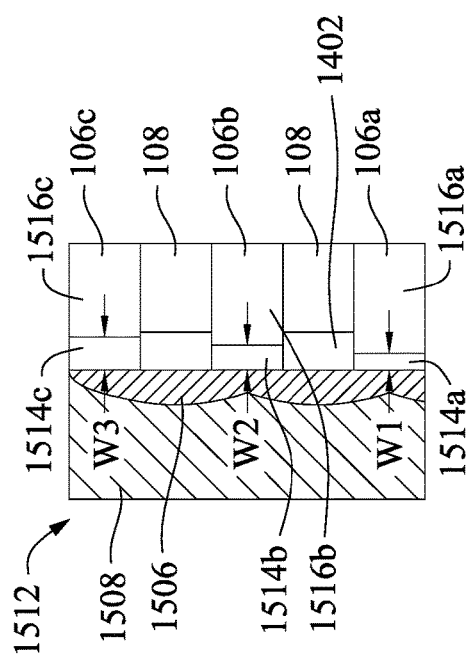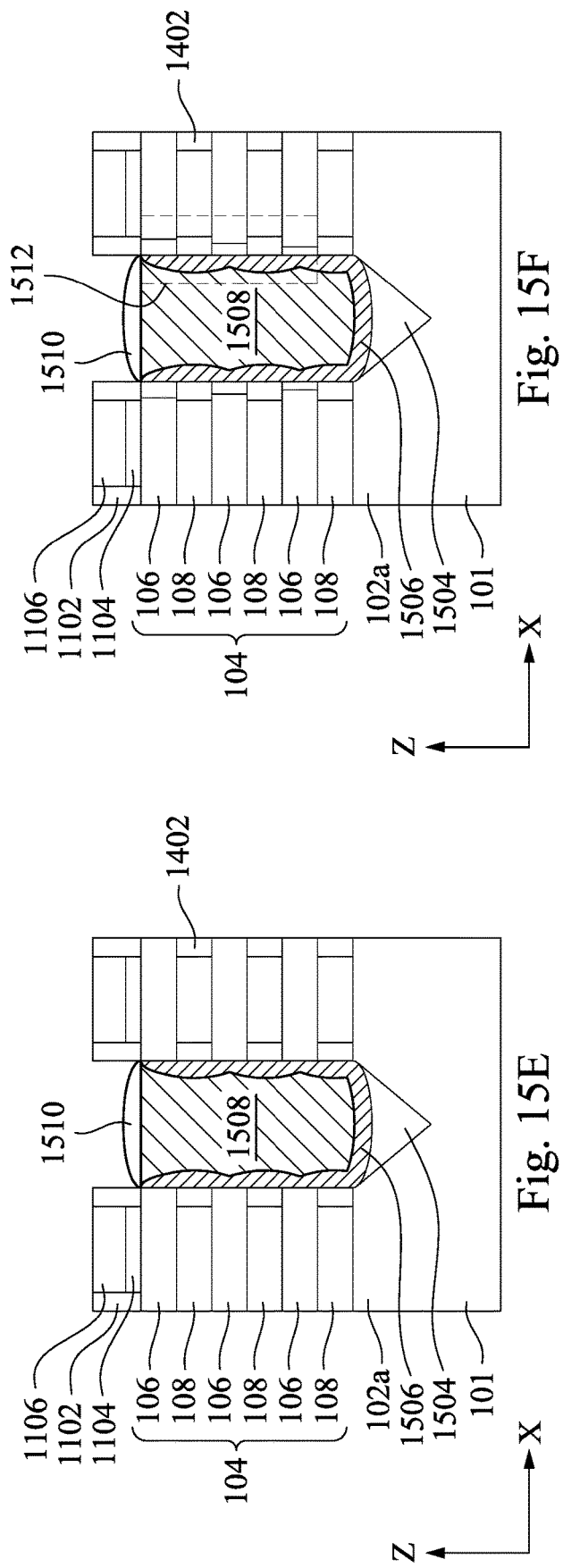

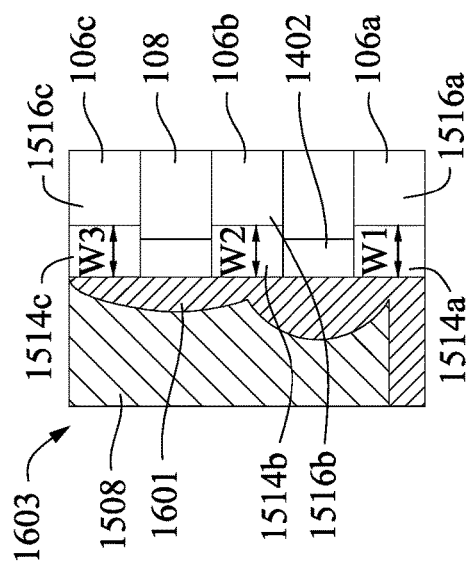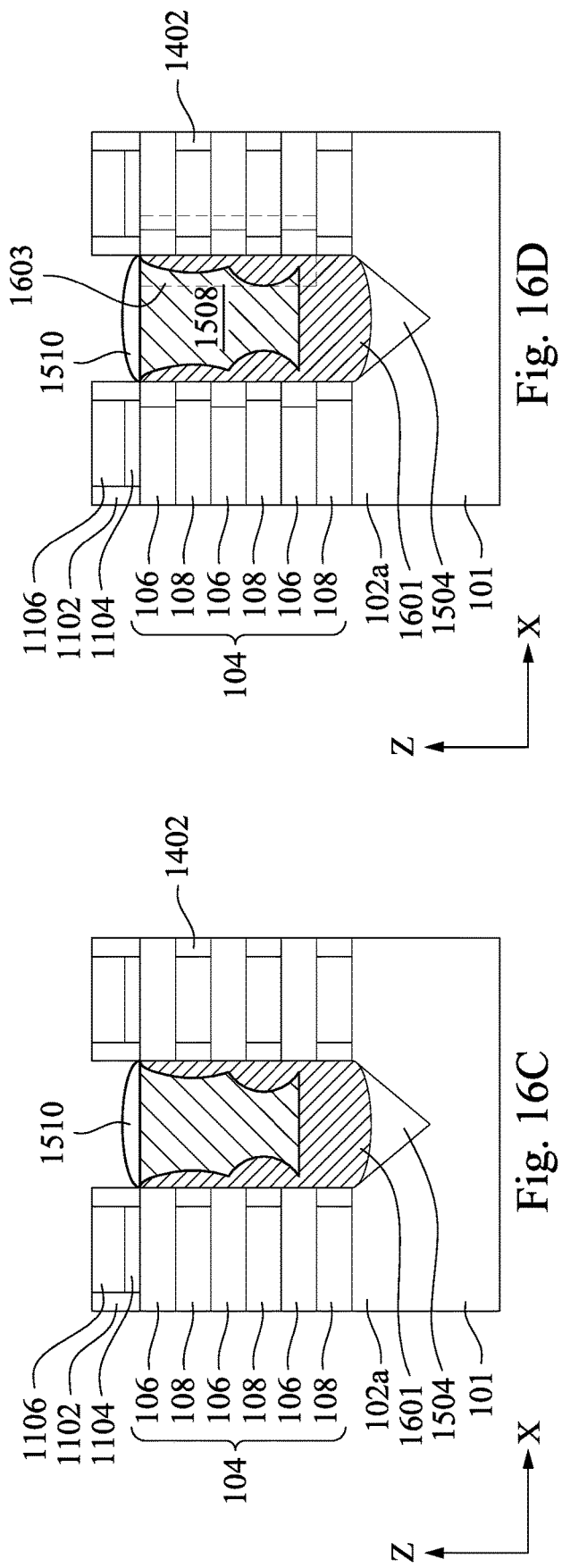

SEMICONDUCTOR DEVICE STRUCTURE AND METHODS OF FORMING THE SAME

CROSS-REFERENCE TO RELATED APPLICATIONS

This application is a continuation application of U.S. patent application Ser. No. 17/206,018 filed Mar. 18, 2021, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A-15F are partial cross-sectional side views of various stages of manufacturing the semiconductor device structure taken along line A-A of FIG. 14, in accordance with some embodiments.

FIG. 15G is an enlarged cross-sectional side view of a portion of the semiconductor device structure shown in FIG. 15F, in accordance with some embodiments.

FIGS. 16A-16D are partial cross-sectional side views of various stages of manufacturing the semiconductor device structure taken along line A-A of FIG. 14, in accordance with alternative embodiments.

FIG. 16E is an enlarged cross-sectional side view of a portion of the semiconductor device structure shown in FIG. 16D, in accordance with some embodiments.

DETAILED DESCRIPTION

Figure 1:
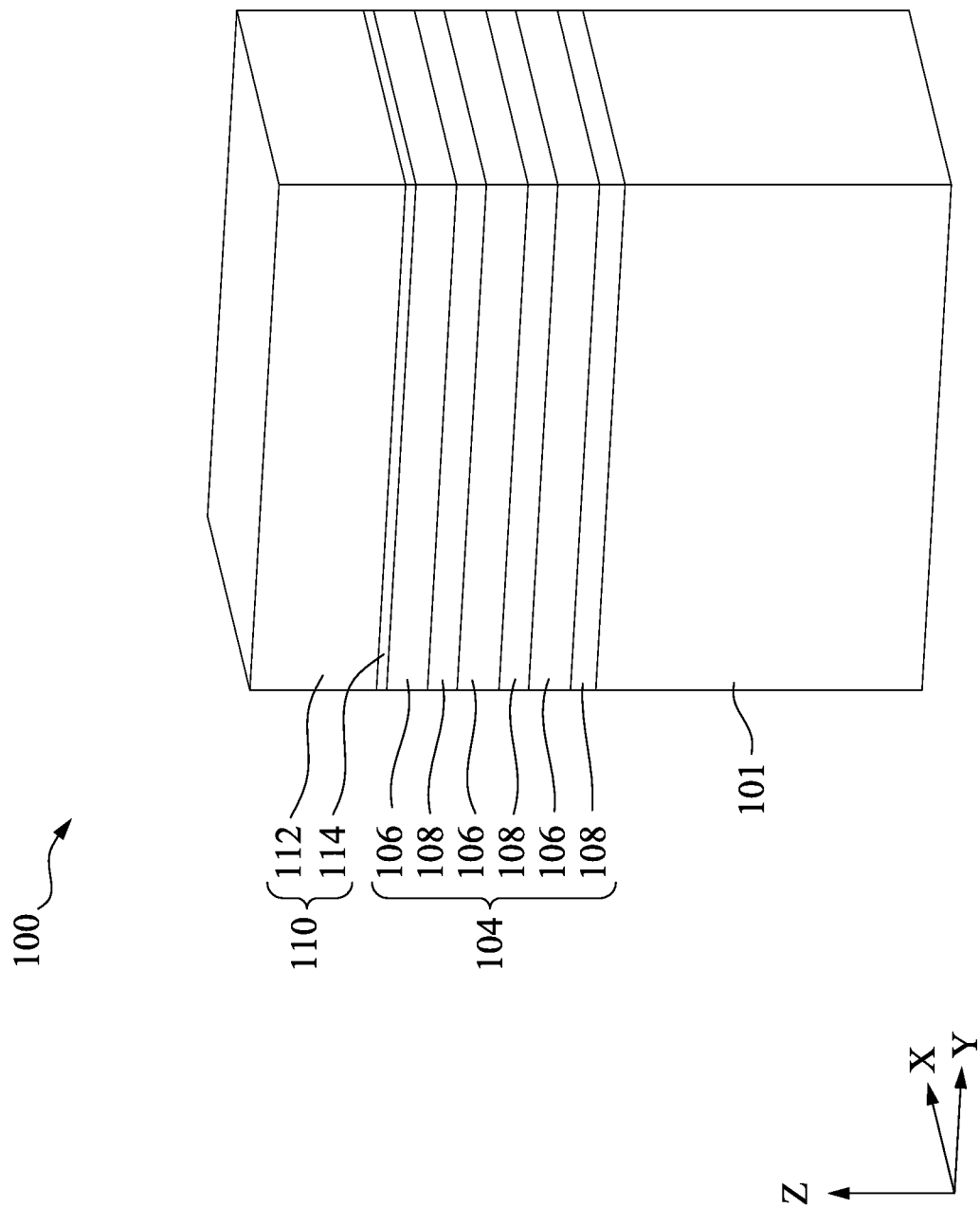
FIGS. 1-14 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20 show exemplary sequential processes for manufacturing a semiconductor device structure 100, in accordance with some embodiments. It is understood that additional operations can be provided before, during, and after processes shown by FIGS. 1-20 and some of the operations described below can be replaced or eliminated, for additional embodiments of the method. The order of the operations/processes may be interchangeable.

FIGS. 1-14 are perspective views of various stages of manufacturing a semiconductor device structure, in accordance with some embodiments. As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the topmost buffer layer.

The substrate 101 may include various regions that have been suitably doped with impurities (e.g., p-type or n-type impurities). The dopants are, for example boron for a p-type field effect transistor (FET) and phosphorus for an n-type FET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In one aspect, the first semiconductor layers 106 are made of undoped Si. The second semiconductor layers 108 may be doped to enhance etching selectivity against the first semiconductor layers 106. In some embodiments, the stack of semiconductor layers 104 includes alternating first and second semiconductor layers 106, 108. The first semiconductor layers 106 or portions thereof may form nanostructure channel(s) of the semiconductor device structure 100 at a later stage. The semiconductor device structure 100 may include a nano structure transistor. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 10 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A mask structure 110 is formed over the stack of semiconductor layers 104. The mask structure 110 may include an oxygen-containing layer 114 and a nitrogen-containing layer 112. The oxygen-containing layer 114 may be a pad oxide layer, such as a $SiO_2$ layer. The nitrogen-containing layer 112 may be a pad nitride layer, such as $Si_3N_4$. The mask structure 110 may be formed by any suitable deposition process, such as chemical vapor deposition (CVD) process.

Figure 2:
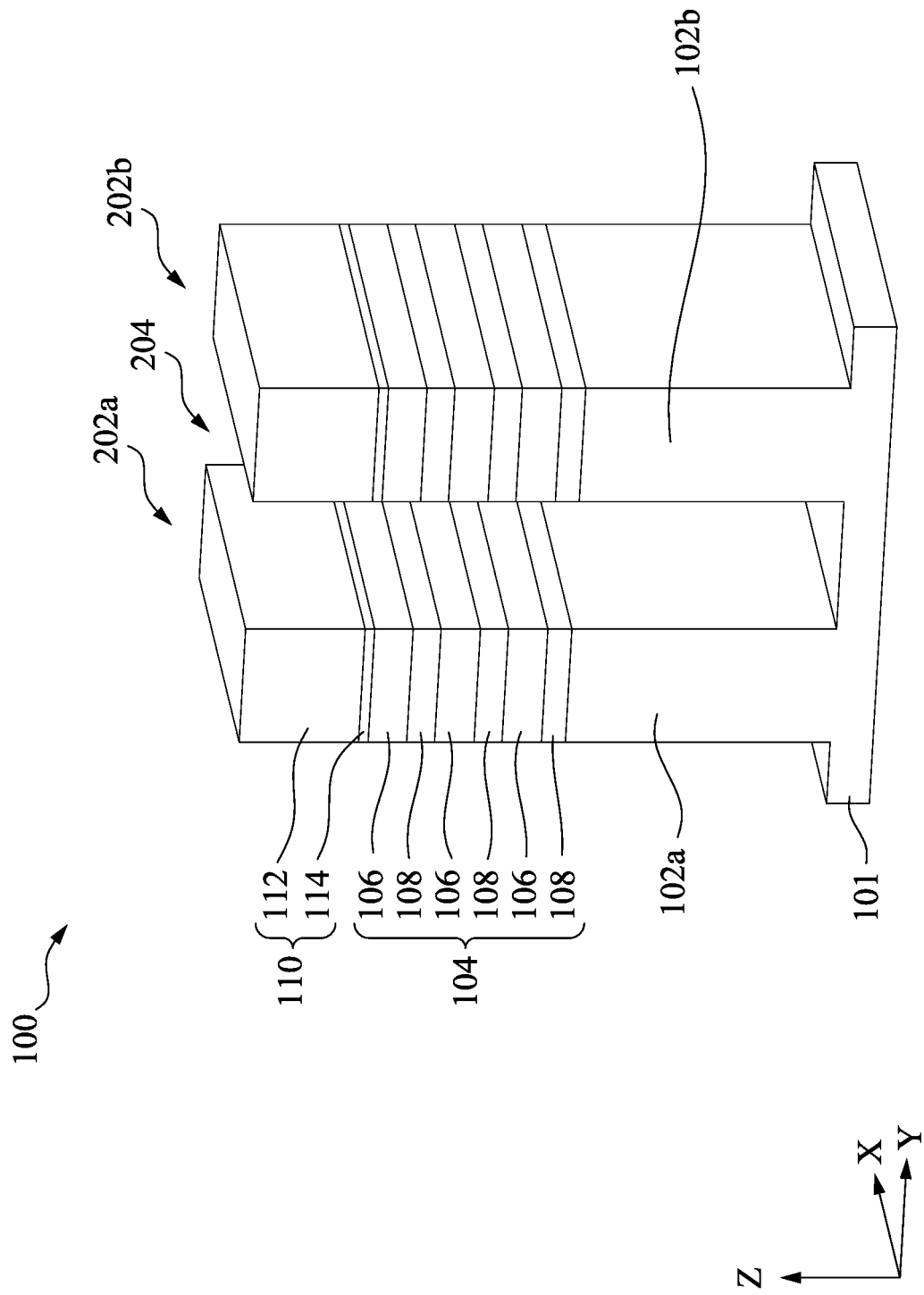

FIG. 2 is a perspective view of one of the various stages of manufacturing the semiconductor device structure 100, in accordance with some embodiments. As shown in FIG. 2, fins 202a and 202b are formed. In some embodiments, each fin 202a, 202b includes a substrate portion 102a, 102b formed from the substrate 101, a portion of the stack of semiconductor layers 104, and a portion of the mask structure 110. The fins 202a, 202b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202a, 202b by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two.

In some embodiments, the fins 202a, 202b may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 104, and into the substrate 101, thereby leaving the extending fins 202a, 202b. The trenches 204 may be etched using a dry etch (e.g., RIE), a wet etch, and/or combination thereof.

Figure 3:
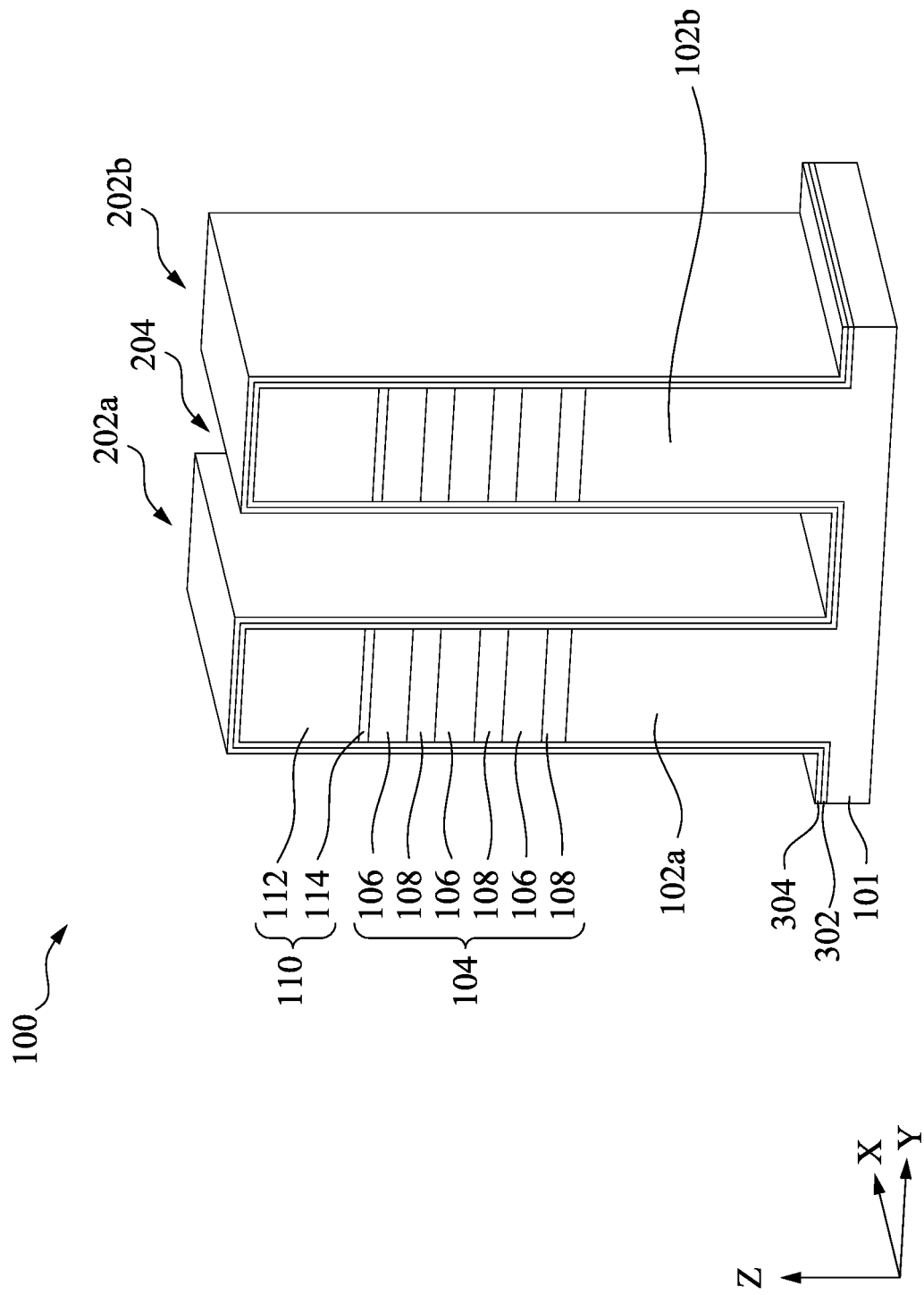

FIG. 3 is a perspective view of one of the various stages of manufacturing the semiconductor device structure 100, in accordance with some embodiments. As shown in FIG. 3, a liner 304 is formed over the substrate 101 and the fins 202a, 202b. In some embodiments, an optional liner 302 may be formed on the substrate 101 and fins 202a, 202b, and the liner 304 is formed on the optional liner 302. The liner 304 may be made of a semiconductor material, such as Si. In some embodiments, the liner 304 is made of the same material as the substrate 101. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
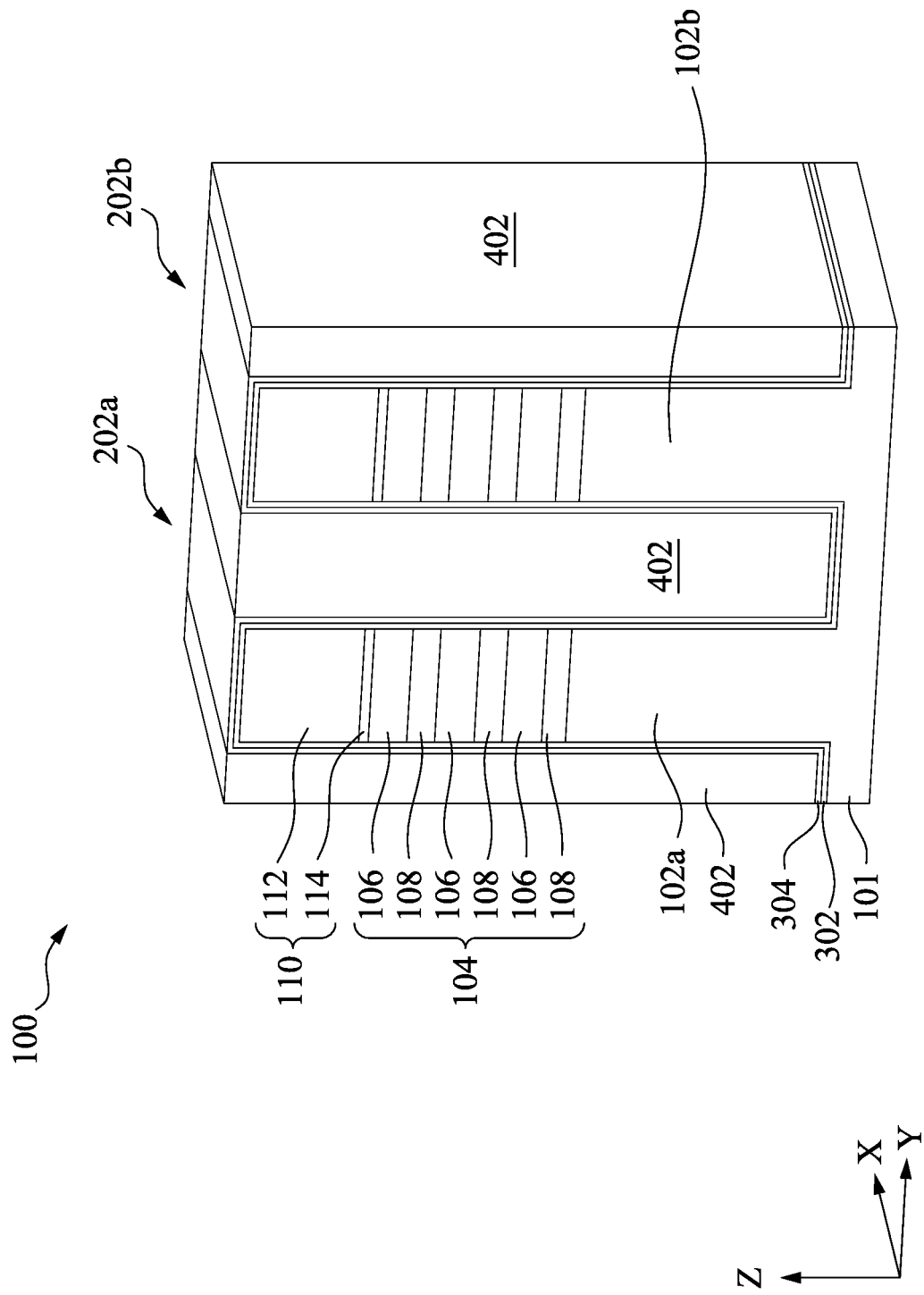

FIG. 4 is a perspective view of one of the various stages of manufacturing the semiconductor device structure 100, in accordance with some embodiments. As shown in FIG. 4, an insulating material 402 is formed on the substrate 101. The insulating material 402 fills the trench 204 (FIG. 2). The insulating material 402 may be first formed over the substrate 101 so that the fins 202a, 202b are embedded in the insulating material 402. Then, a planarization operation, such as a chemical mechanical polishing (CMP) process and/or an etch-back process, is performed such that the tops of the fins 202a, 202b (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
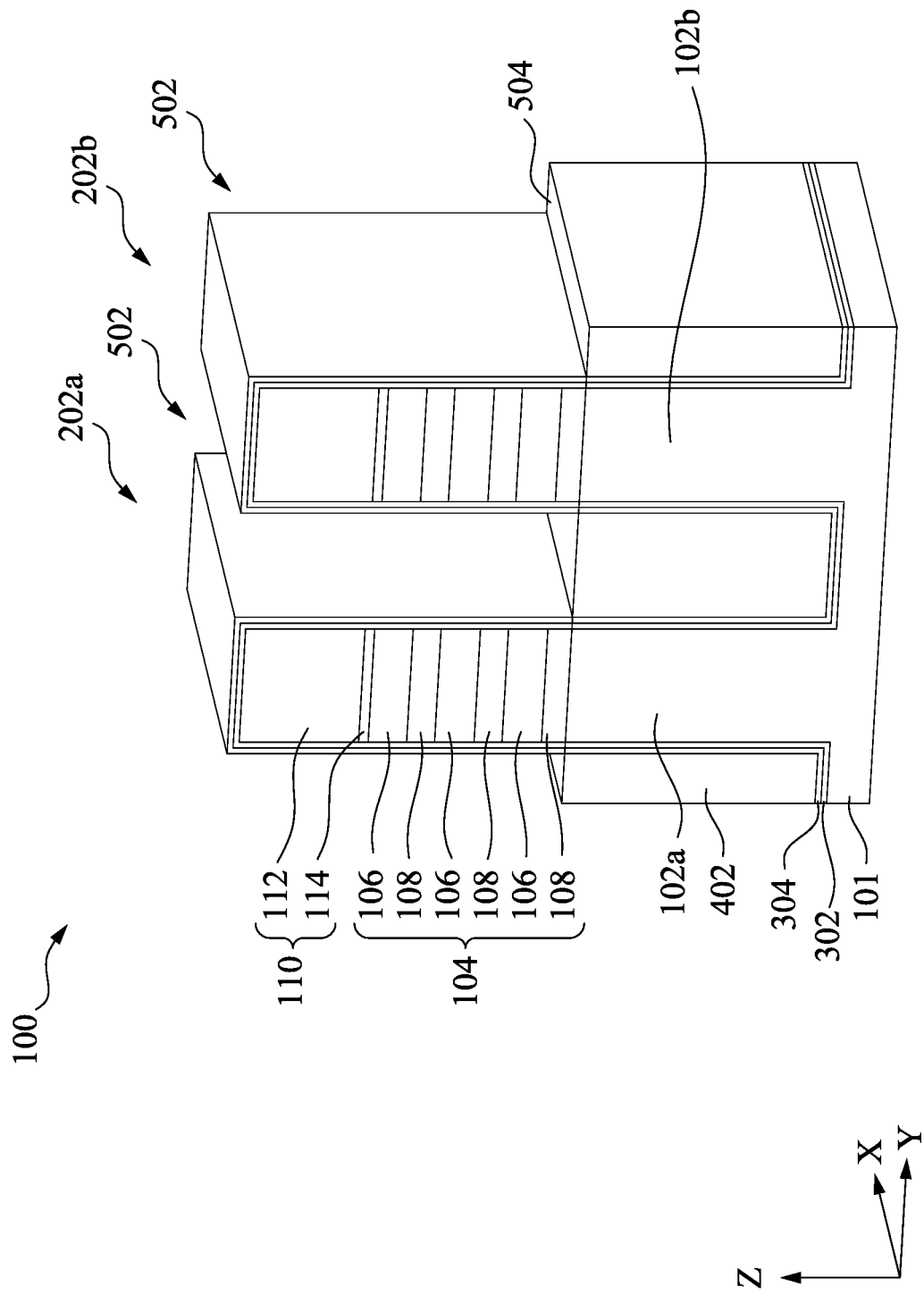

As shown in FIG. 5, the insulating material 402 may be recessed by removing a portion of the insulating material 402 located between adjacent fins 202a, 202b to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the second semiconductor layers 108 in contact with the substrate portions 102a, 102b of the substrate 101.

Figure 6:
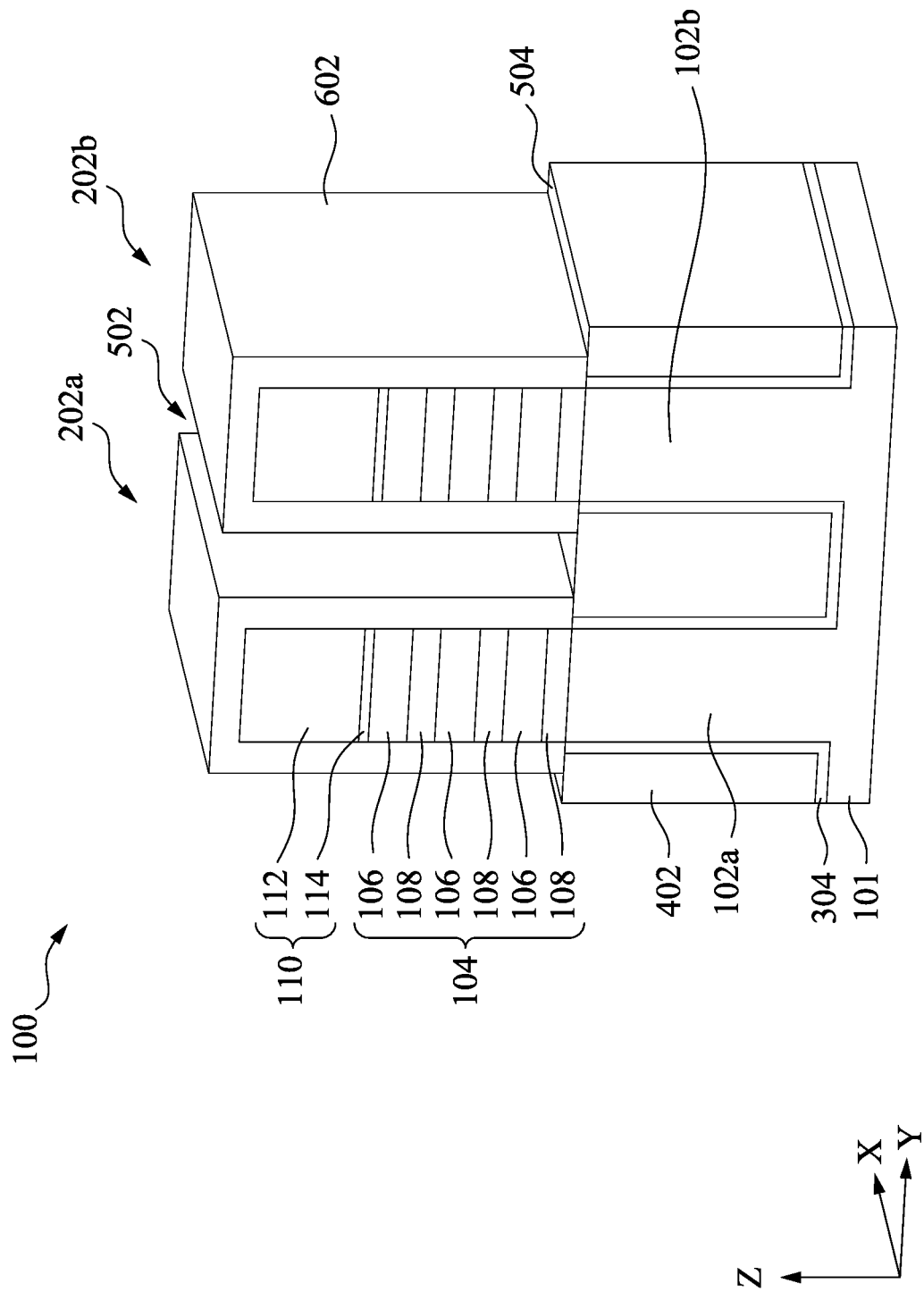

As shown in FIG. 6, a cladding layer 602 is formed on the exposed surface of the liner 304 (FIG. 5), and the optional liner 302 is omitted for clarity. The liner 304 may be diffused into the cladding layer 602 during the formation of the cladding layer 602. Thus, in some embodiments where the optional liner 302 does not exist, the cladding layer 602 is in contact with the stack of semiconductor layers 104, as shown in FIG. 6. In some embodiments, the cladding layer 602 includes a semiconductor material. The cladding layer 602 grows on semiconductor materials but not on dielectric materials. For example, the cladding layer 602 includes SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. The etch process may remove some of the semiconductor layer formed on the top of the fins 202a, 202b, and the cladding layer 602 formed on the top of the fins 202a, 202b may have a curved profile instead of a flat profile. In some embodiments, the cladding layer 602 and the second semiconductor layers 108 include the same material having the same etch selectivity. For example, the cladding layer 602 and the second semiconductor layers 108 include SiGe. The cladding layer 602 and the second semiconductor layer 108 may be removed subsequently to create space for the gate electrode layer.

Figure 7:
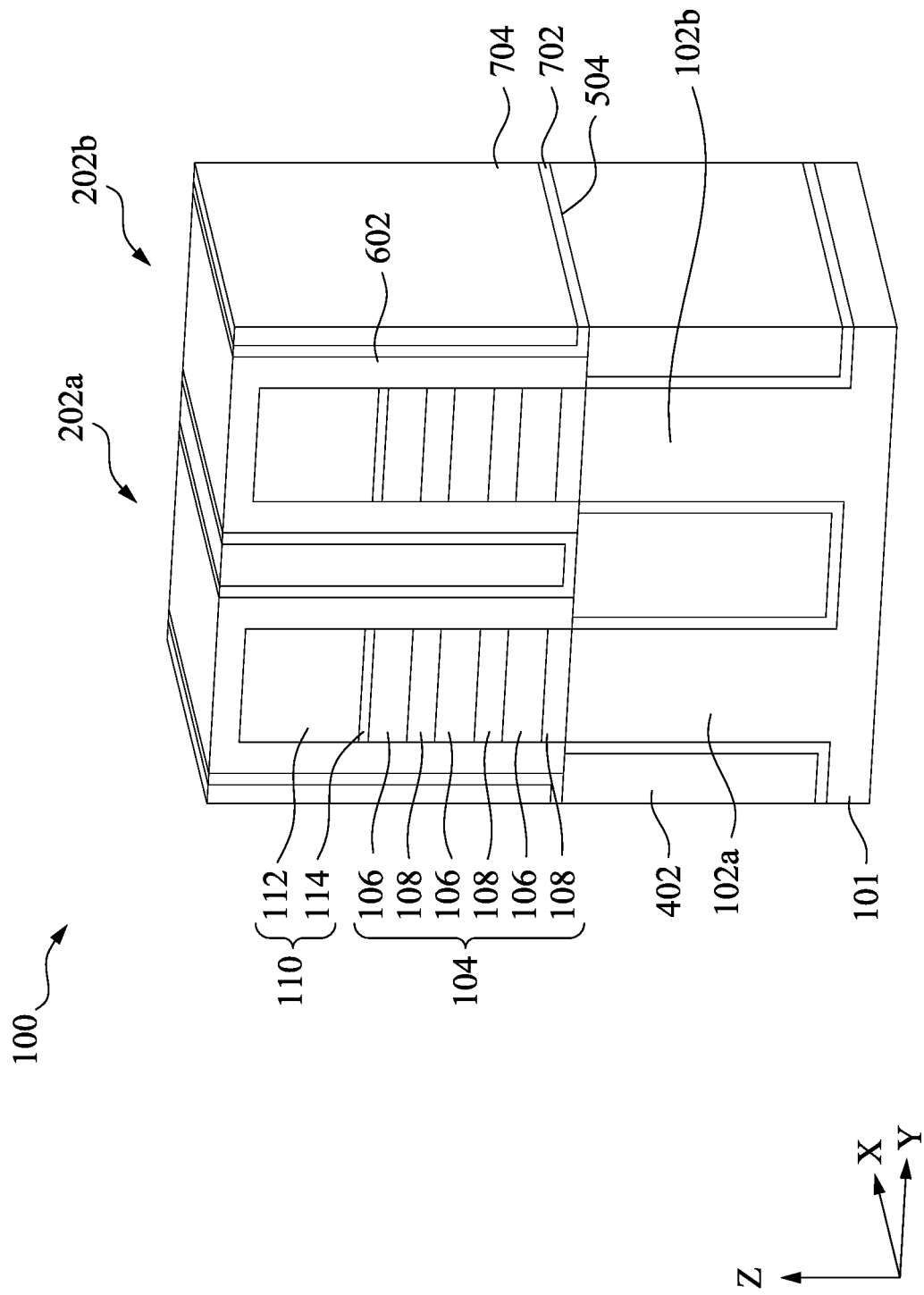

As shown in FIG. 7, a liner 702 is formed on the cladding layer 602 and the top surface 504 of the insulating material 402. The liner 702 may include a dielectric material having a K value lower than 7, such as $SiO_2$, SiN, SiCN, SiOC, or SiOCN. The liner 702 may be formed by a conformal process, such as an ALD process. The liner 702 may have a thickness ranging from about 1 nm to about 6 nm. The liner 702 may function as a shell to protect a flowable oxide material to be formed in the trenches 502 (FIG. 5) during subsequent removal of the cladding layer 602. Thus, if the thickness of the liner 702 is less than about 1 nm, the flowable oxide material may not be sufficiently protected. On the other hand, if the thickness of the liner 702 is greater than about 6 nm, the trenches 502 (FIG. 5) may be filled.

A dielectric material 704 is formed in the trenches 502 (FIG. 5) and on the liner 702, as shown in FIG. 7. The dielectric material 704 may be an oxygen-containing material, such as an oxide, formed by FCVD. The oxygen-containing material may have a K value less than about 7, for example less than about 3. The width of the dielectric material 704 along the Y direction may be defined by the width of the trench 502 and the thickness of the liner 702. In some embodiments, the width of the dielectric material 704 ranges from about 8 nm to about 30 nm. A planarization process, such as a CMP process, may be performed to remove portions of the liner 702 and the dielectric material 704 formed over the fins 202a, 202b. The portion of the cladding layer 602 disposed on the nitrogen-containing layer 112 may be exposed after the planarization process.

Figure 8:
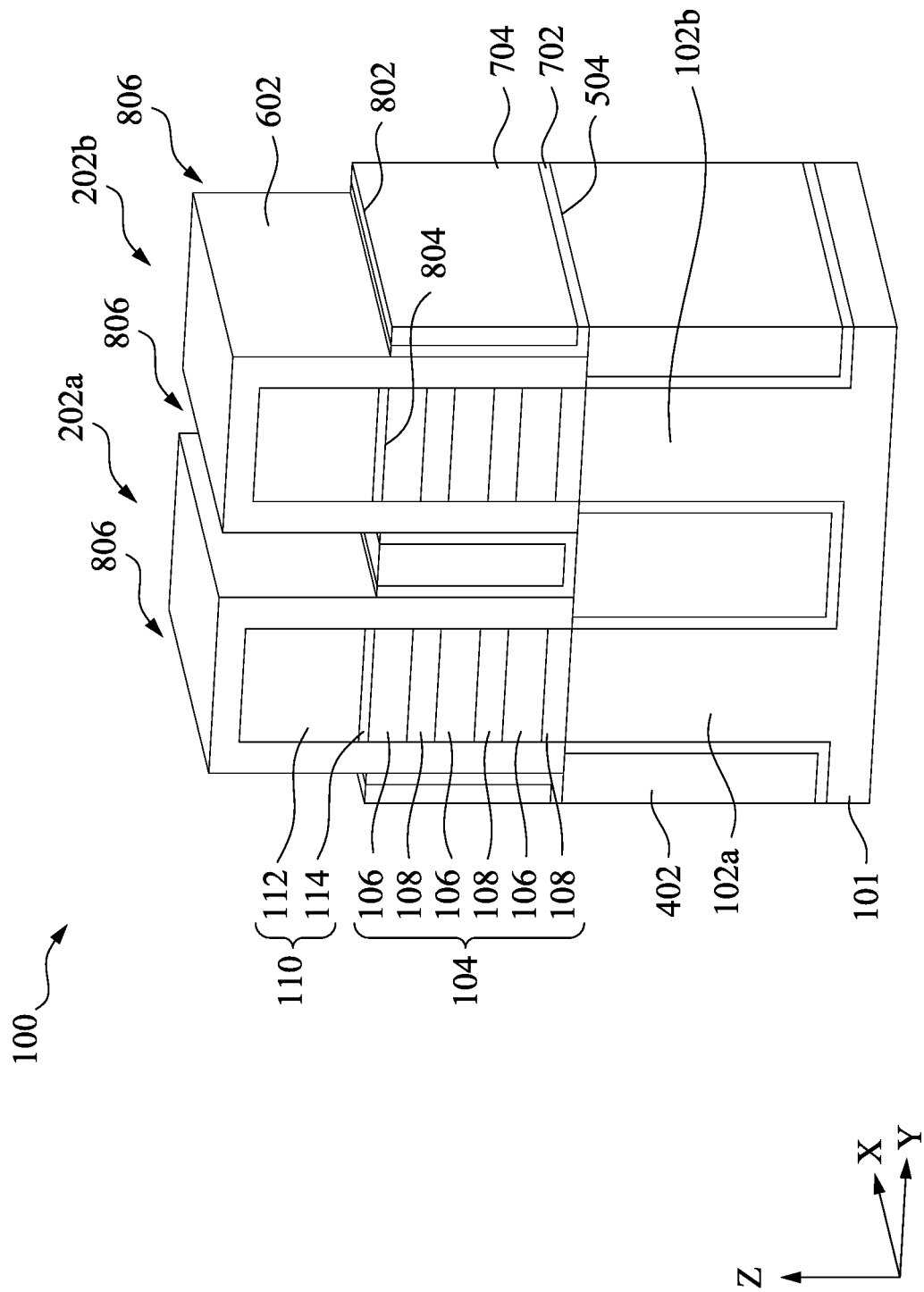

As shown in FIG. 8, the liner 702 and the dielectric material 704 are recessed to the level of the top first semiconductor layer 106. For example, in some embodiments, after the recess process, the dielectric material 704 may include a top surface 802 that is substantially level with a top surface 804 of the top first semiconductor layer 106. The top surface 804 of the top first semiconductor layer 106 may be in contact with the mask structure 110, such as in contact with the oxygen-containing layer 114. The liner 702 may be recessed to the same level as the dielectric material 704. The recess of the liners 702 and the dielectric material 704 may be performed by any suitable process, such as dry etch, wet etch, or a combination thereof. In some embodiments, a first etch process may be performed to recess the dielectric material 704 followed by a second etch process to recess the liner 702. The etch processes may be selective etch processes that do not remove the semiconductor material of the cladding layer 602. As a result of the recess process, trenches 806 are formed between the fins 202a, 202b.

Figure 9:
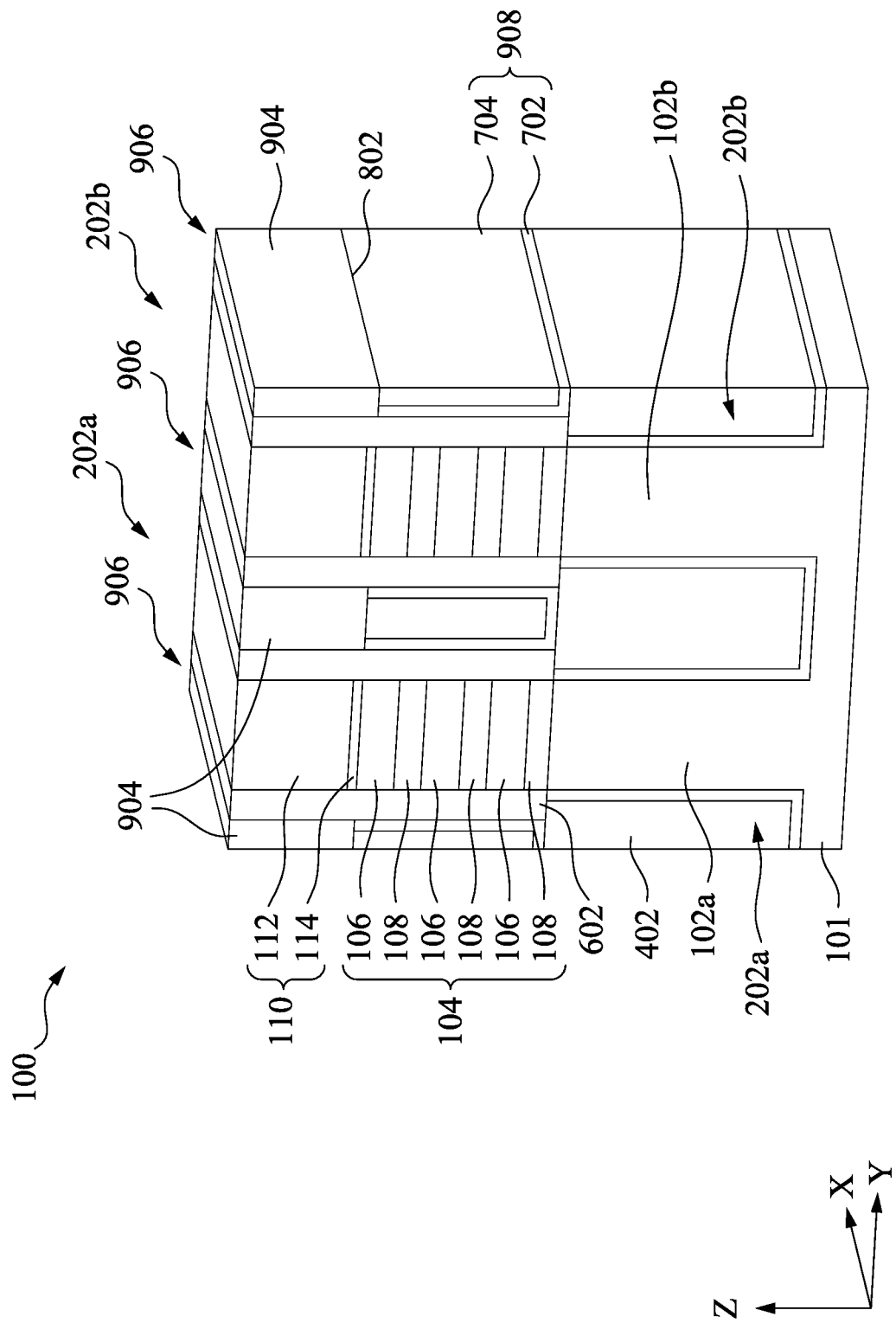

A dielectric material 904 is formed in the trenches 806 (FIG. 8) and on the dielectric material 704 and the liner 702, as shown in FIG. 9. The dielectric material 904 may include SiO, SiN, SiC, SiCN, SiON, SiOCN, AlO, AlN, AlON, ZrO, ZrN, ZrAlO, HfO, or other suitable dielectric material. In some embodiments, the dielectric material 904 includes a high-K dielectric material. The dielectric material 904 may be formed by any suitable process, such as a CVD, PECVD, FCVD, or ALD process. The dielectric material 904 may have a thickness ranging from about 5 nm to about 20 nm. The dielectric material 904 may fill the trenches 806 (FIG. 8). Thus, if the thickness of the dielectric material 904 is less than about 5 nm, the trenches 806 may not be filled. On the other hand, if the thickness of the dielectric material 904 is greater than about 20 nm, the manufacturing cost may be increased without significant advantage.

Figure 20:
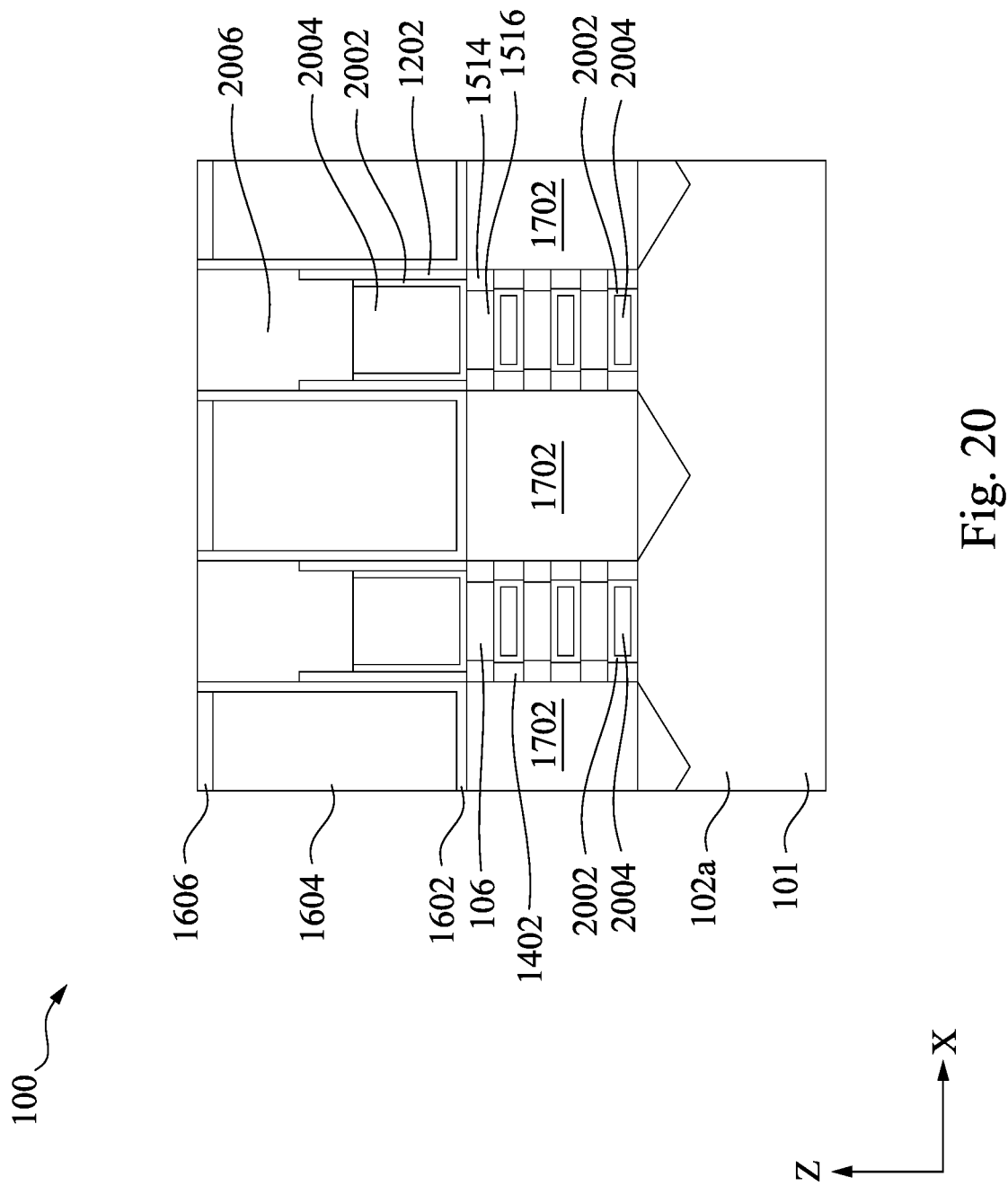

A planarization process is performed to expose the nitrogen-containing layer 112 of the mask structure 110, as shown in FIG. 9. The planarization process may be any suitable process, such as a CMP process. The planarization process removes portions of the dielectric material 904 and the cladding layer 602 disposed over the mask structure 110. The liner 702, the dielectric material 704, and the dielectric material 904 together may be referred to as a dielectric feature 906. The dielectric feature 906 includes a bottom portion 908 having a shell, which is the liner 702, and a core, which is the dielectric material 704. The dielectric feature further includes a top portion, which is the dielectric material 904. The dielectric feature 906 may be a dielectric fin that separates adjacent source/drain (S/D) epitaxial features 1702 (FIG. 17) and adjacent gate electrode layers 2004 (FIG. 20). In some embodiments, the dielectric feature 906 includes a single dielectric material or two dielectric materials.

Figure 10:
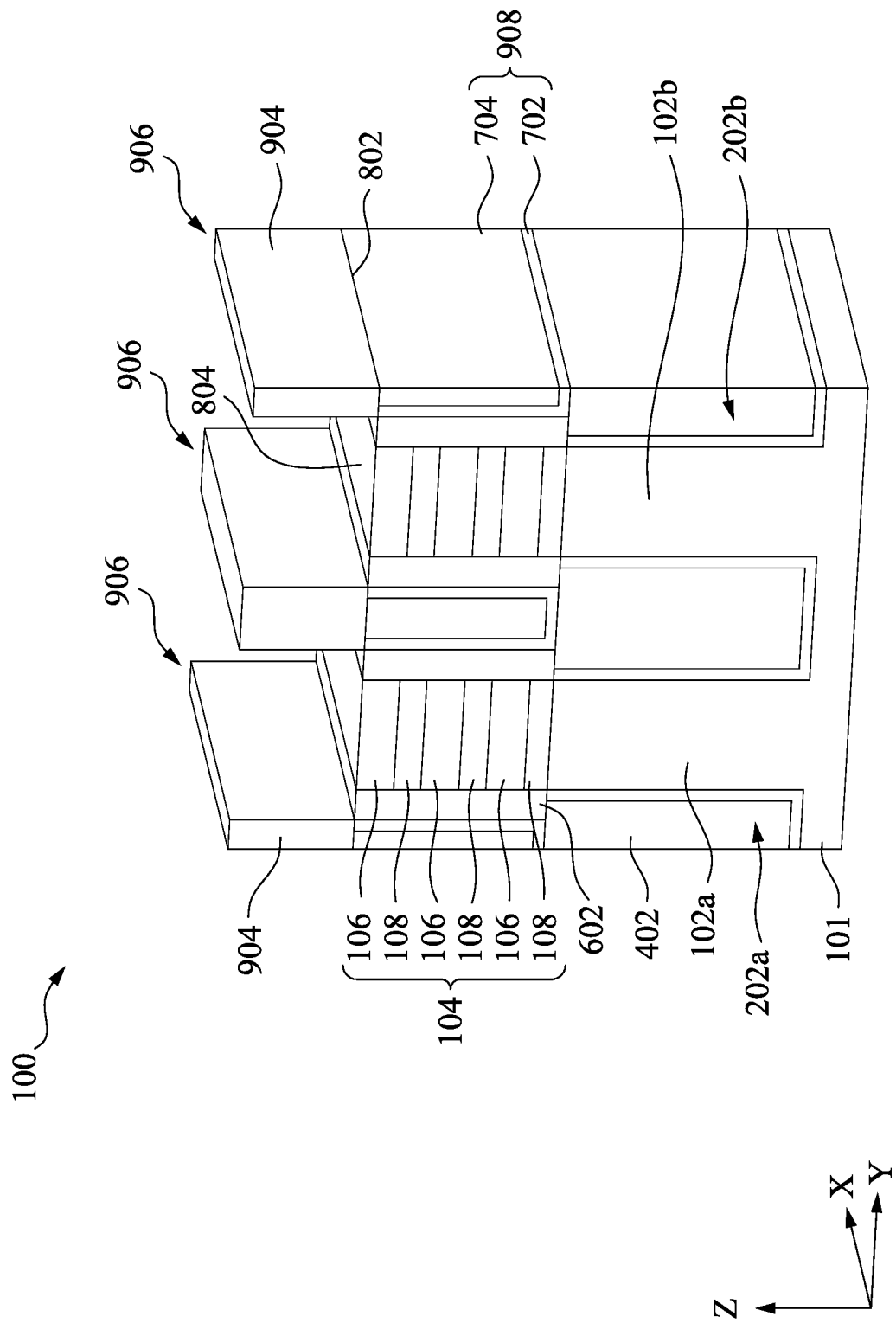

As shown in FIG. 10, the cladding layers 602 are recessed, and the mask structures 110 are removed. The recess of the cladding layers 602 may be performed by any suitable process, such as dry etch, wet etch, or a combination thereof. The recess process may be controlled so that the remaining cladding layers 602 are substantially at the same level as the top surface 804 of the top first semiconductor layer 106 in the stack of semiconductor layers 104. The etch process may be a selective etch process that does not remove the dielectric material 904. The removal of the mask structures 110 may be performed by any suitable process, such as dry etch, wet etch, or a combination thereof. The removal of the mask structure 110 exposes the top surfaces 804 of the top first semiconductor layers 106 in the stacks of semiconductor layers 104.

Figure 11:
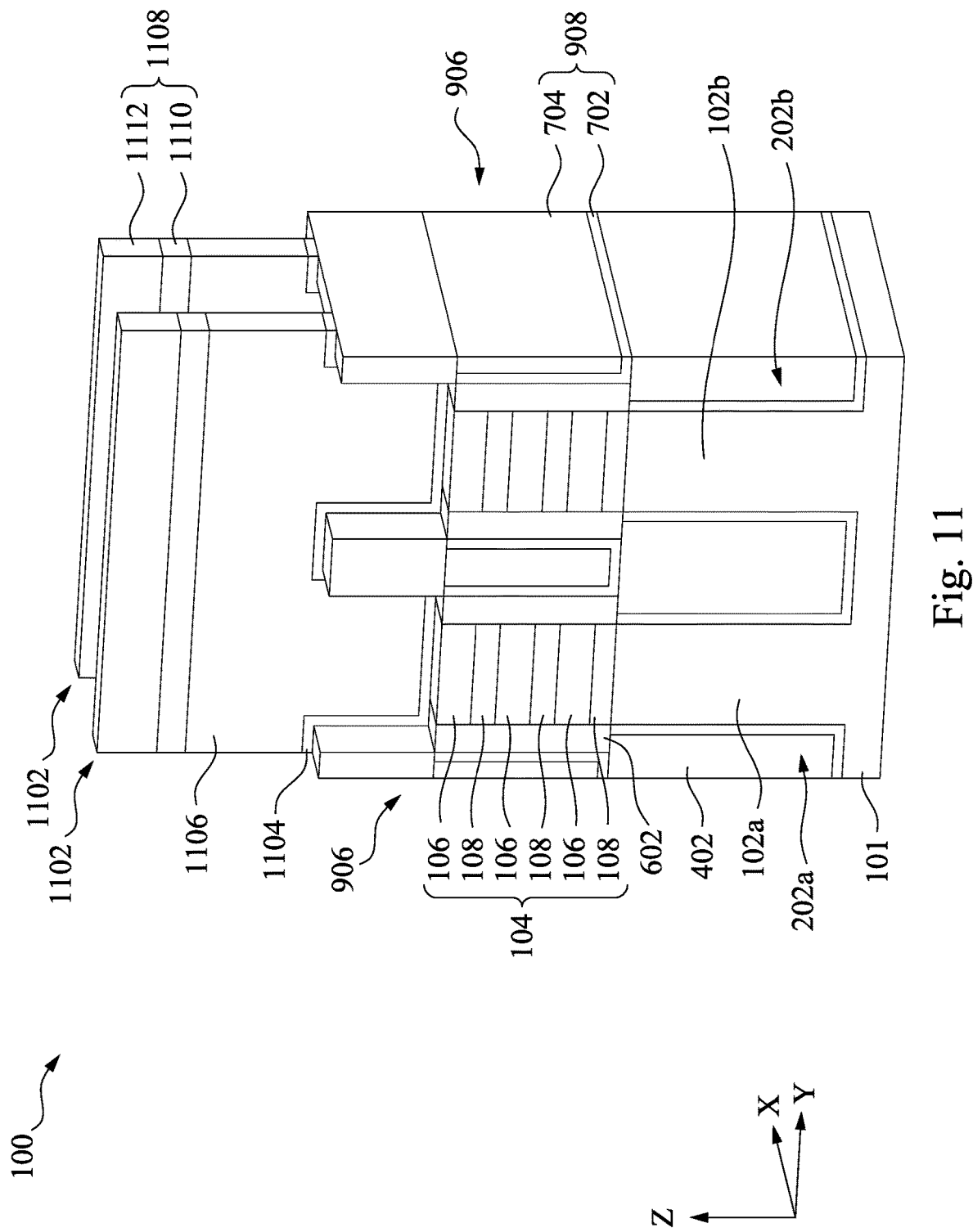

As shown in FIG. 11, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-K dielectric material, and/or other suitable dielectric material. In some embodiments, the sacrificial gate dielectric layer 1104 includes a material different from the dielectric material 904. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 104 of the fins 202a, 202b are partially exposed on opposite sides of the sacrificial gate stack 1102. As shown in FIG. 11, two sacrificial gate stacks 1102 are formed, but the number of the sacrificial gate stacks 1102 is not limited to two. More than two sacrificial gate stacks 1102 are arranged along the Y direction in some embodiments.

Figure 12:
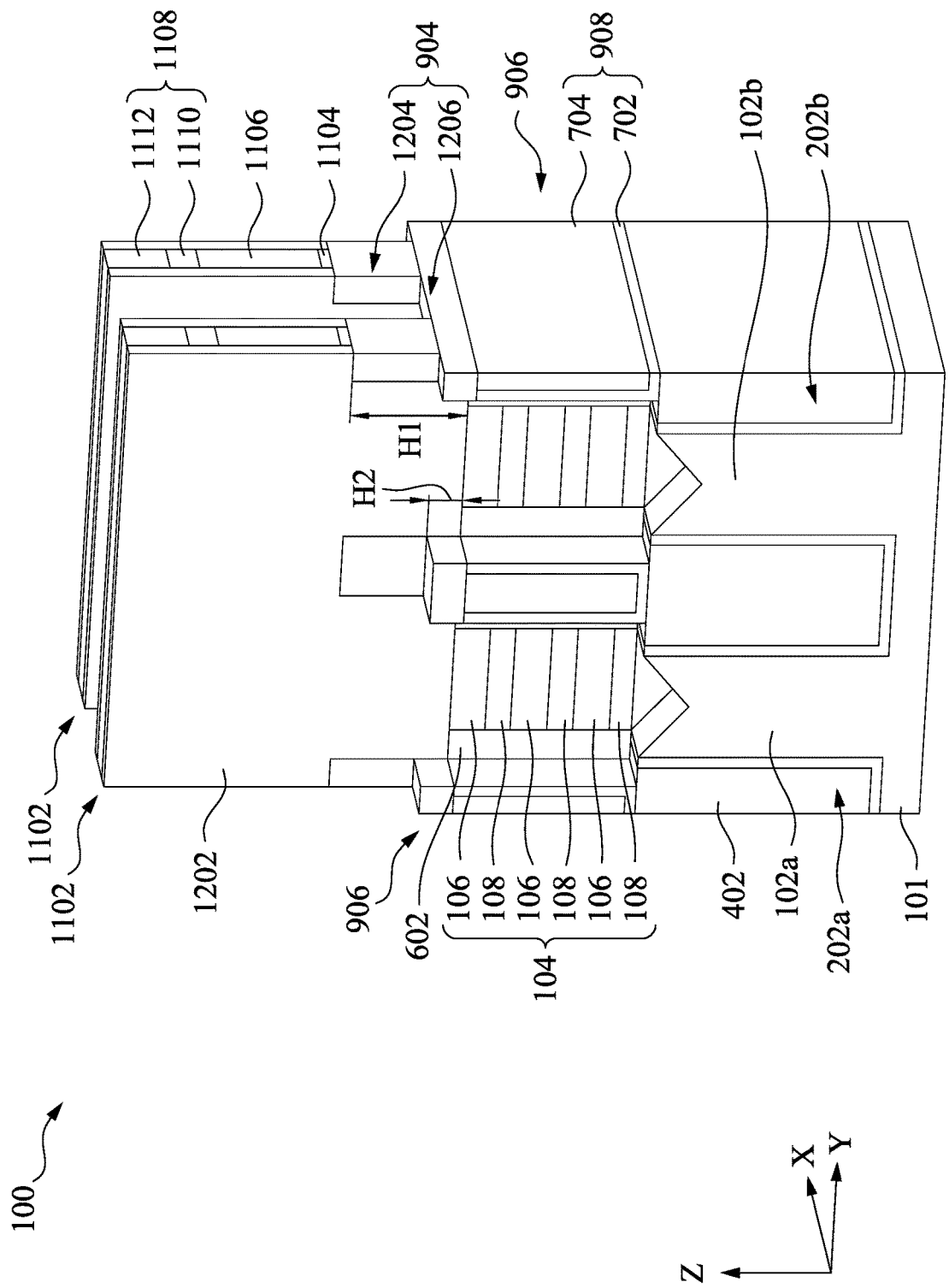

As shown in FIG. 12, a spacer 1202 is formed on the sidewalls of the sacrificial gate stacks 1102. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202a, 202b, the cladding layer 602, the dielectric material 904, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Next, exposed portions of the fins 202a, 202b, exposed portions of the cladding layers 602, exposed portions of the dielectric material 904 not covered by the sacrificial gate stacks 1102 and the spacers 1202 are removed and recessed by using one or more suitable etch processes, such as dry etch, wet etch, or a combination thereof. In some embodiments, exposed portions of the stacks of semiconductor layers 104 of the fins 202a, 202b are removed, exposing portions of the substrate portions 102a, 102b, respectively. In some embodiments, a portion of the substrate portions 102a, 102b may be also removed. As shown in FIG. 12, the exposed portions of the fins 202a, 202b are recessed to a level below the top surface 504 of the insulating material 402. The recess processes may include an etch process that recesses the exposed portions of the fins 202a, 202b and the exposed portions of the cladding layers 602.

In some embodiments, the etch process may reduce the height of the exposed top portion (e.g., the dielectric material 904) of the dielectric feature 906 from H1 to H2, as shown in FIG. 12. Thus, a first portion 1204 of the dielectric material 904 under the sacrificial gate stack 1102 and the spacers 1202 has the height H1, while a second portion 1206 of the dielectric material 904 located between S/D epitaxial features 1702 (FIG. 17) has the height H2 less than the height H1.

At this stage, end portions of the stacks of semiconductor layers 104 under the sacrificial gate stacks 1102 and the spacers 1202 have substantially flat surfaces which may be flush with corresponding spacers 1202. In some embodiments, the end portions of the stacks of semiconductor layers 104 under the sacrificial gate stacks 1102 and spacers 1202 are slightly horizontally etched.

Figure 13:
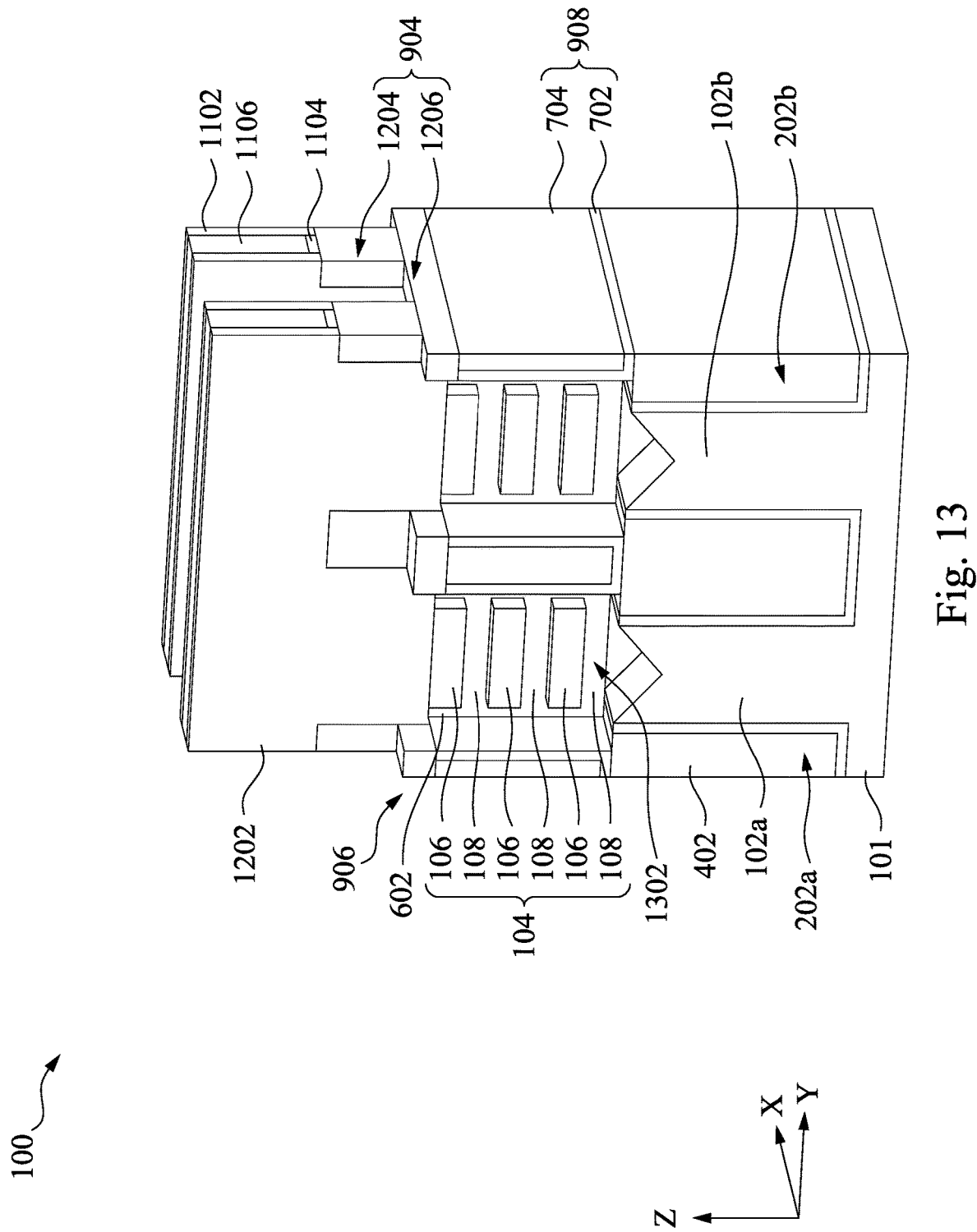

As shown in FIG. 13, the edge portions of each second semiconductor layer 108 and edge portions of the cladding layers 602 are removed, forming gaps 1302. In some embodiments, the portions of the second semiconductor layers 108 and cladding layers 602 are removed by a selective wet etch process that does not remove the first semiconductor layers 106. For example, in cases where the second semiconductor layers 108 are made of SiGe, and the first semiconductor layers 106 are made of silicon, a selective wet etch including an ammonia and hydrogen peroxide mixtures (APM) may be used.

Figure 14:
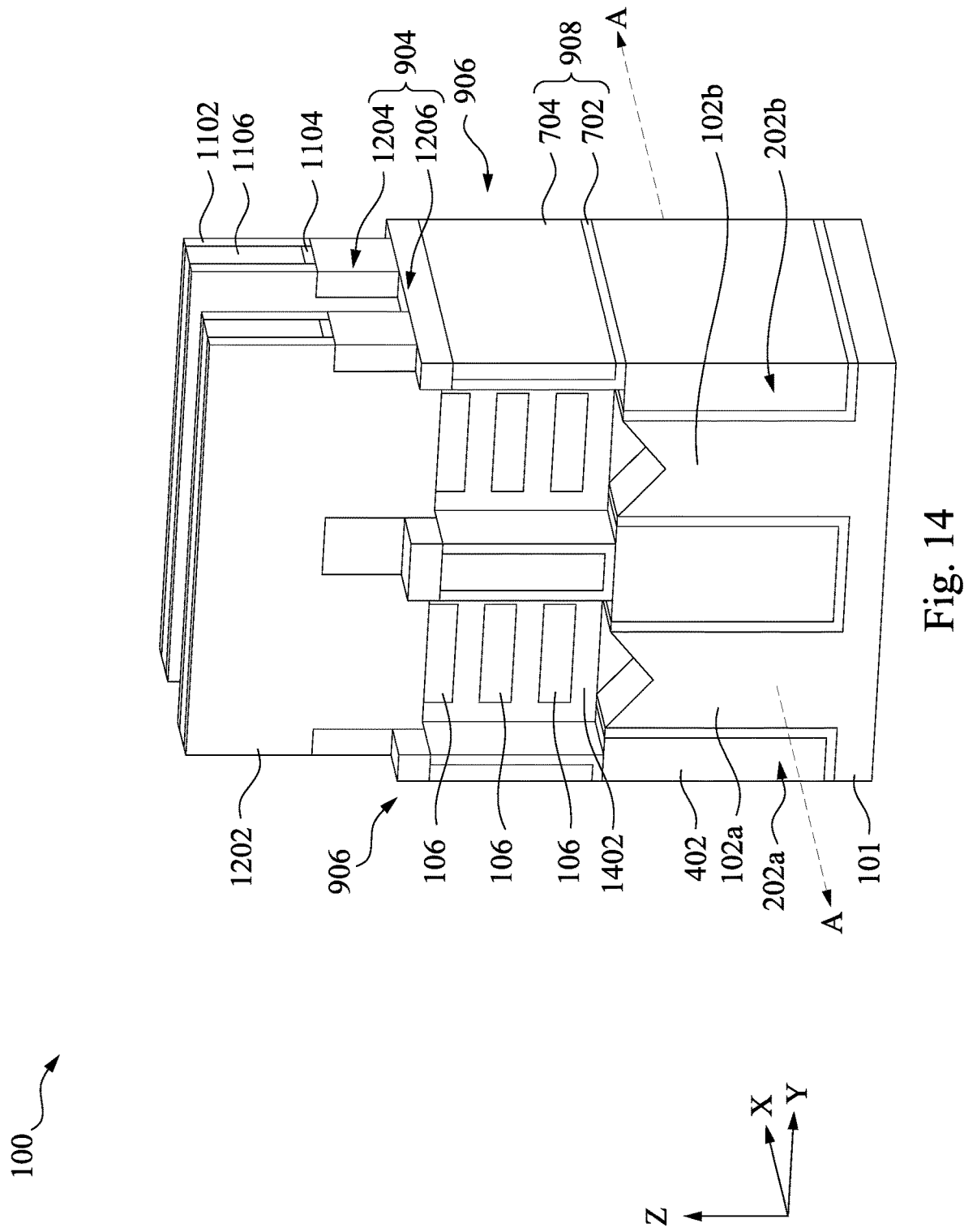

As show in FIG. 14, dielectric spacers 1402 are formed in the gaps 1302. In some embodiments, the dielectric spacers 1402 may be made of SiON, SiCN, SiOC, SiOCN, or SiN. In some embodiments, the dielectric spacers 1402 may be formed by first forming a conformal dielectric layer using a conformal deposition process, such as ALD, followed by an anisotropic etch to remove portions of the conformal dielectric layer other than the dielectric spacers 1402. The dielectric spacers 1402 may be protected by the first semiconductor layers 106 and the spacers 1202 during the anisotropic etch process. In some embodiments, the dielectric spacers 1402 may be flush with the spacers 1202.

Figure 15B:
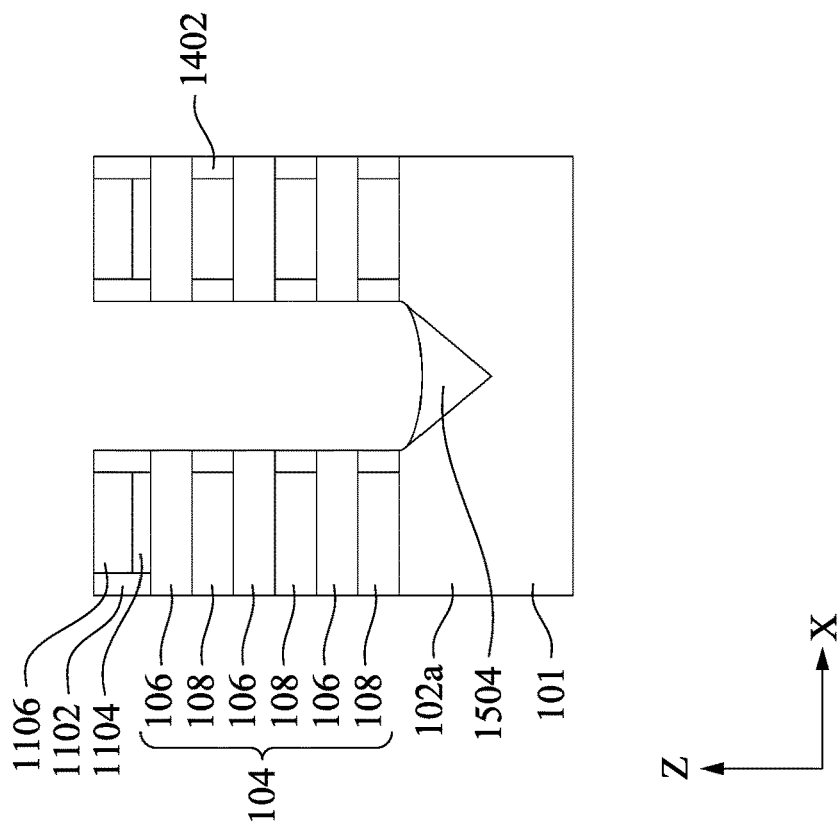
Figure 15A:
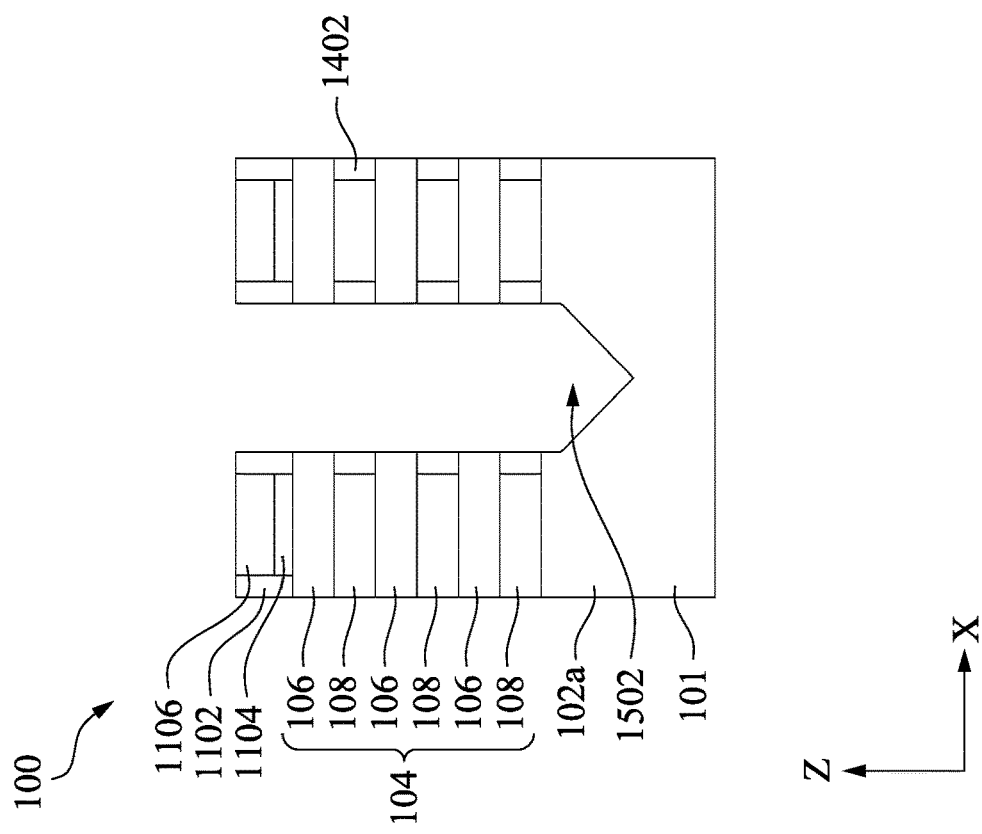

FIGS. 15A-15F are partial cross-sectional side views of various stages of manufacturing the semiconductor device structure 100 taken along line A-A of FIG. 14, in accordance with some embodiments. FIG. 15A is a partial cross-sectional side view of the semiconductor device structure 100 taken along line A-A of FIG. 14. As shown in FIG. 15A, in some embodiments, a portion of the substrate portion 102a is removed during the removal of the exposed portion of the stack of semiconductor layers 104 or during the removal of the edge portions of the second semiconductor layers 108 and the edge portions of the cladding layers 602, and a recess 1502 is formed in the substrate portion 102a. In some embodiments, $Ch_3F/O_2$ and HBr/He global etching is used to remove the exposed portion of the stack of semiconductor layers 104. In addition, cyclic dry and wet etching may be used to clean the remaining residue. For example, the wet etching process may utilize a high-temperature sulfuric acid-hydrogen peroxide mixture (HTSPM) solution and diluted hydrofluoric acid (DHF). The recess 1502 may have any suitable cross-sectional shape, such as triangle or "U" shaped.

As shown in FIG. 15B, a first semiconductor material 1504 is formed in the recess 1502. The first semiconductor material 1504 may include doped Si or doped SiGe. In some embodiments, an n-type epitaxial feature is to be formed from the substrate portion 102a, and the first semiconductor material 1504 includes Si doped with an n-type dopant, such as As or P. The n-type dopant concentration may range from about $1\times10^{19}/cm^3$ to about $5\times10^{20}/cm^3$. In some embodiments, a p-type epitaxial feature is to be formed from the substrate portion 102a, and the first semiconductor material 1504 includes SiGe doped with a p-type dopant, such as B. For example, the first semiconductor material 1504 includes boron doped SiGe having 5 atomic percent to about 40 atomic percent of Ge and a dopant concentration ranging from about $1\times10^{19}/cm^3$ to about $8\times10^{20}/cm^3$. The first semiconductor material 1504 may be first formed on semiconductor surfaces, such as in the recess 1502 and on the first semiconductor layers 106, by epitaxy. A subsequent etch process is performed to remove the portions of the first semiconductor material 1504 formed on the first semiconductor layers 106. The first semiconductor material 1504 formed in the recess 1502 may form a concave top surface as the result of the etch process. In some embodiments, the first semiconductor material 1504 has a thickness ranging from about 5 nm to about 50 nm along the Z direction.

Figure 15D:
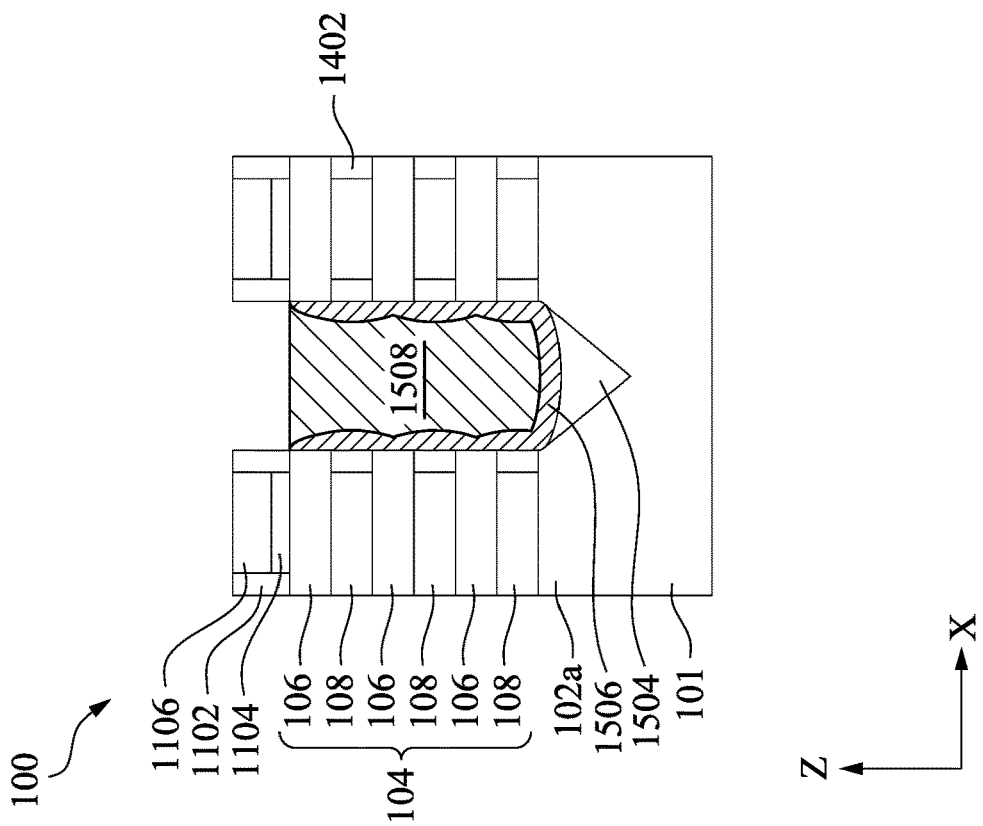
Figure 15C:
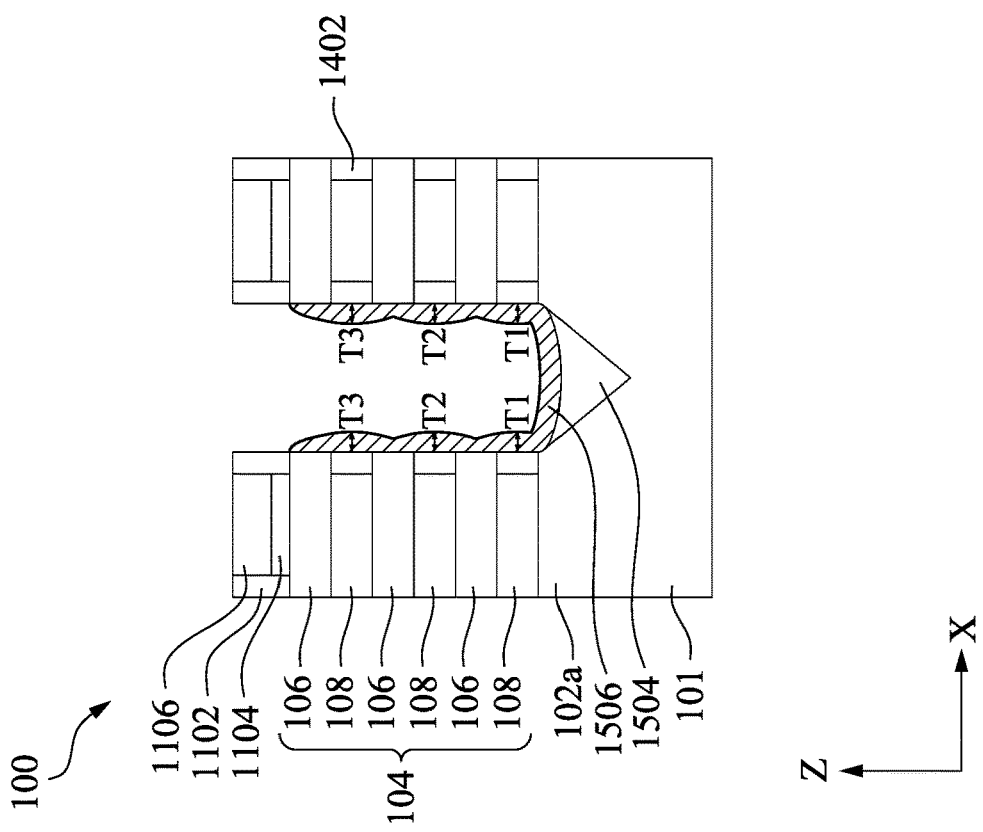

As shown in FIG. 15C, a second semiconductor material 1506 is formed on the first semiconductor material 1504, the first semiconductor layers 106, and the dielectric spacers 1402. The second semiconductor material 1506 may be formed by CVD, such as remote plasma CVD (RPCVD). The second semiconductor material 1506 may include silicon doped with an n-type dopant for an n-type epitaxial feature or SiGe doped with a p-type dopant for a p-type epitaxial feature. For example, the second semiconductor material 1506 may be SiGe doped with a dopant, and the second semiconductor material 1506 has 25 atomic percent to about 45 atomic percent of Ge. In some embodiments, the second semiconductor material 1506 has a higher germanium atomic percentage than the first semiconductor material 1504. In some embodiments, the dopant concentration of the second semiconductor material 1506 may range from about $1\times10^{20}/cm^3$ to about $8\times10^{20}/cm^3$. In some embodiments, the second semiconductor material 1506 has a higher dopant concentration than the first semiconductor material 1504.

In some embodiment, as shown in FIG. 15C, the portions of the second semiconductor material 1506 disposed on the first semiconductor layers 106 have the same thickness. For example, the stack of semiconductor layers 104 includes at least 2 vertically stacked first semiconductor layers 106, such as 3 vertically stacked first semiconductor layers 106, as shown in FIG. 15C. The portion of the second semiconductor material 1506 disposed on the bottom first semiconductor layer 106 has a first thickness T1 along the X direction. The portion of the second semiconductor material 1506 disposed on the middle first semiconductor layer 106 has a second thickness T2 along the X direction. The portion of the second semiconductor material 1506 disposed on the top first semiconductor layer 106 has a third thickness T3 along the X direction. In some embodiments, the thicknesses T1, T2, T3 are substantially the same, such as from about 5 nm to about 10 nm.

As shown in FIG. 15D, a third semiconductor material 1508 is formed on the second semiconductor material 1506. The third semiconductor material 1508 may be formed by epitaxy. The third semiconductor material 1508 may include Si doped with an n-type dopant for an n-type epitaxial feature or SiGe doped with a p-type dopant for a p-type epitaxial feature. For example, the third semiconductor material 1508 may be SiGe doped with a dopant, and the third semiconductor material 1508 has 40 atomic percent to about 60 atomic percent of Ge. In some embodiments, the third semiconductor material 1508 has a higher germanium atomic percentage than the second semiconductor material 1506. In some embodiments, the dopant concentration of the third semiconductor material 1508 may range from about $5\times10^{20}/cm^3$ to about $4\times10^{21}/cm^3$. In some embodiments, the third semiconductor material 1508 has a higher dopant concentration than the second semiconductor material 1506. An etch back process may be performed on the third semiconductor material 1508 so a top surface of the third semiconductor material 1508 may be substantially level with a top surface of the top first semiconductor layer 106, as shown in FIG. 15D.

As shown in FIG. 15E, a fourth semiconductor material 1510 is formed on the top surface of the third semiconductor material 1508. The fourth semiconductor material 1510 may be formed by epitaxy. The fourth semiconductor material 1510 may include doped Si for an n-type epitaxial feature or doped SiGe for a p-type epitaxial feature. For example, the fourth semiconductor material 1510 may be doped SiGe having 45 atomic percent to about 55 atomic percent of Ge. In some embodiments, the dopant concentration of the fourth semiconductor material 1510 may range from about $1\times10^{21}/cm^3$ to about $2\times10^{21}/cm^3$. The first, second, third, fourth semiconductor materials 1504, 1506, 1508, 1510 together may be referred to as a source/drain (S/D) epitaxial feature, which may be an n-type epitaxial feature or a p-type epitaxial feature. The S/D epitaxial features may be the S/D regions. In this disclosure, a source and a drain are interchangeably used, and the structures thereof are substantially the same. In some embodiments, the S/D epitaxial feature may have a width along the X direction ranging from about 10 nm to about 50 nm.

FIG. 15G is an enlarged cross-sectional side view of a portion 1512 of the semiconductor device structure 100 shown in FIG. 15F, in accordance with some embodiments. As shown in FIGS. 15F and 15G, a thermal annealing is performed on the semiconductor device structure 100, and dopants in the second semiconductor material 1506 are diffused into the first semiconductor layers 106 (106a, 106b, 106c) to form doped regions 1514 (1514a, 1514b, 1514c). As shown in FIG. 15G, the first semiconductor layer 106b is disposed over the first semiconductor layer 106a, and the first semiconductor layer 106c is disposed over the first semiconductor layer 106b. The thermal annealing may be exposing the semiconductor device structure 100 to a heat source from above, and doped regions 1514a, 1514b, 1514c are portions of the first semiconductor layers 106a, 106b, 106c with dopants diffused thereinto, respectively. As a result, the doped regions 1514a, 1514b, 1514c may have different widths along the X direction. As shown in FIG. 15G, the doped region 1514a in the bottom first semiconductor layer 106a has a width W1, the doped region 1514b in the middle first semiconductor layer 106b has a width W2, and the doped region 1514c in the top first semiconductor layer 106c has a width W3. In some embodiments, the width W3 is greater than the width W2, which is greater than the width W1, because the temperature profile decreases from the top first semiconductor layer 106c to the bottom first semiconductor layer 106a due to the heat source located above the semiconductor device structure 100. In some embodiments, the width W1 ranges from about 1 nm to about 3 nm, the width W2 ranges from about 2 nm to about 4 nm, and the width W3 ranges from about 3 nm to about 5 nm.

In some embodiments, the heat source is located below the semiconductor device structure 100, and the width W1 is greater than the width W2, which is greater than the width W3. The doped regions 1514a, 1514b, 1514c function as extended S/D regions, which controls effective gate length in nanostructure transistors and improves device performance. The remaining undoped regions 1516a, 1516b, 1516c of the first semiconductor layers 106a, 106b, 106c function as the channels. In some embodiments, the vertically stacked channels (i.e., the undoped regions 1516a, 1516b, 1516c) in contact with one S/D epitaxial feature (i.e., the first, second, third, and fourth semiconductor materials 1504, 1506, 1508, 1510 and the doped regions 1514) have different widths. The semiconductor device structure 100 shown in FIGS. 15A-15G show one S/D epitaxial feature disposed between two sets of first semiconductor layers 106. Additional S/D epitaxial features are formed on other sides of the two sets of the first semiconductor layers 106, and each first semiconductor layer 106 includes two doped regions 1514 and an undoped region 1516 between the two doped regions 1514.

The thermal annealing may be in-situ or ex-situ with nitrogen or hydrogen gas present. The thermal annealing may be any suitable annealing process, such as rapid thermal anneal (RTA), sub-melt millisecond anneal (MSA), or dynamic surface annealing (DSA). In some embodiments, the thermal annealing is a spike rapid thermal anneal (RTA), and the semiconductor device structure 100 is heated to a temperature greater than about 510 degrees Celsius and less than about 1050 degrees Celsius. If the temperature of the semiconductor device structure 100 is heated to 1050 degrees Celsius, the dopant diffusion may be significant, leading to the doped regions 1514a, 1514b, 1514c having a width of about 20 nm to about 30 nm. In some embodiments, the width of the first semiconductor layers 106a, 106b, 106c may be less than about 30 nm, such as from about 5 nm to about 30 nm. Thus, if the width of the doped regions 1514a, 1514b, 1514c is greater than about 5 nm, the device may be shorted. On the other hand, if the temperature of the semiconductor device structure 100 is heated to 510 degrees Celsius, the dopant diffusion may be insignificant and would not lead to improved device performance. In some embodiments, the semiconductor device structure 100 is heated to a temperature ranging from about 700 degrees Celsius to about 950 degrees Celsius, such as about 950 degrees Celsius, so the width W3 of the doped region 1514c, which may be the widest doped region, is not greater than about 5 nm, and the width W1 of the doped region 1514a, which may be the narrowest doped region, is not less than about 1 nm. In some embodiments, the thermal annealing is performed for about 1 min to about 10 mins. In some embodiments, the width of the doped region 1514 is about 10 percent to about 40 percent of the width of the undoped region 1516. If the width of the doped region 1514 is less than about 10 percent of the width of the undoped region 1516, the dopant diffusion may be insignificant and would not lead to improved device performance. On the other hand, if the width of the doped region 1514 is greater than about 40 percent of the width of the undoped region 1516, the device may be shorted. In some embodiments, the width of the first semiconductor layer 106 ranges from about 30 nm to about 200 nm, and the width of the doped region 1514 is about 5 percent to about 20 percent of the width of the undoped region 1516. In some embodiments, the width of the undoped region 1516c of the top semiconductor layer 106c is less than the width of the undoped region 1516b of the middle semiconductor layer 106b, which is less than the width of the undoped region 1516a of the bottom semiconductor layer 106a.

In some embodiments, the dopant concentration in the doped regions 1514 decreases from the end in contact with the second semiconductor material 1506 to the end in contact with the undoped region 1516.

Figure 16B:
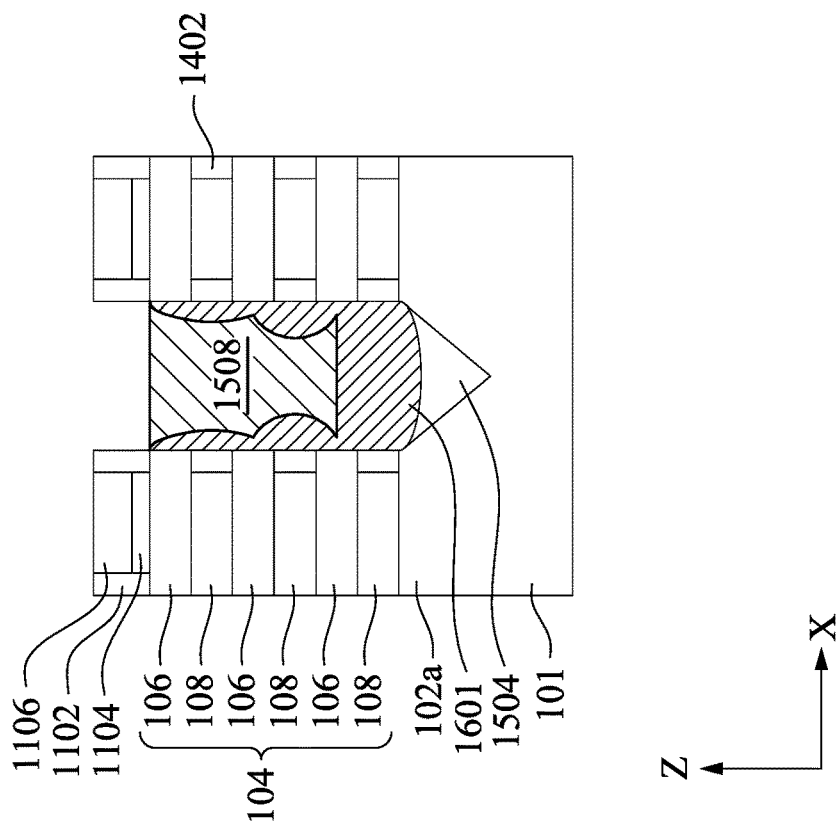
Figure 16A:
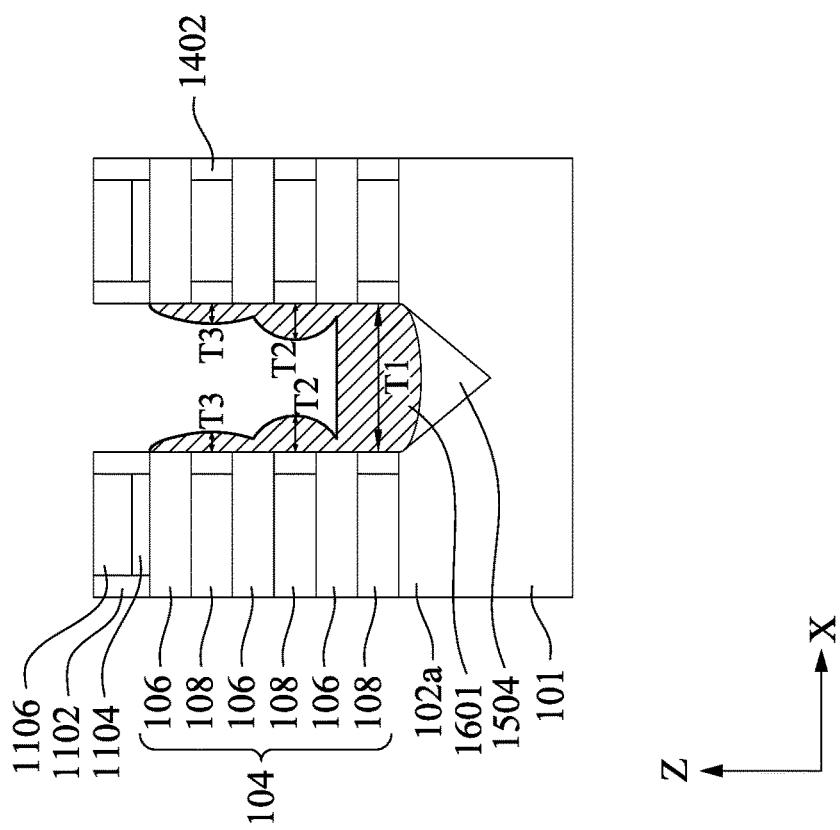

FIGS. 16A-16D are partial cross-sectional side views of various stages of manufacturing the semiconductor device structure 100 taken along line A-A of FIG. 14, in accordance with alternative embodiments. As shown in FIG. 16A, instead of forming the second semiconductor material 1506 having the same thickness on the first semiconductor layers 106, a second semiconductor material 1601 is formed on the first semiconductor material 1504, the first semiconductor layers 106, and the dielectric spacers 1402. The second semiconductor material 1601 may be formed by RPCVD, and an etchant, such as a halogen, may be included in the deposition process. As shown in FIG. 16A, the portions of the second semiconductor material 1601 disposed on the first semiconductor layers 106 have different thickness. For example, the stack of semiconductor layers 104 includes at least 2 vertically stacked first semiconductor layers 106, such as 3 vertically stacked first semiconductor layers 106, as shown in FIG. 16A. The portion of the second semiconductor material 1601 disposed on the bottom first semiconductor layer 106 has the first thickness T1 along the X direction. The portion of the second semiconductor material 1601 disposed on the middle first semiconductor layer 106 has the second thickness T2 along the X direction. The portion of the second semiconductor material 1601 disposed on the top first semiconductor layer 106 has the third thickness T3 along the X direction. In some embodiments, the thicknesses T1, T2, T3 are substantially different, such that the first thickness T1 is substantially greater than the second thickness T2, which is substantially greater than the third thickness T3. The different thickness T3 may be achieved by adding the etchant and tuning the precursor ratio. For example, by increasing the amount of silane and decreasing the amount of dichlorosilane, the portion of the second semiconductor material 1601 formed on the X-Y plane has a faster growth rate than the portion of the second semiconductor material 1601 formed on the Z-Y plane. The addition of the etchant keeps the portion of the second semiconductor material 1601 formed on the top first semiconductor layer 106 (i.e., the opening of a trench) to be thin compared to the portions of the second semiconductor material 1601 formed on the middle and bottom first semiconductor layers 106.

As shown in FIG. 16B, the third semiconductor material 1508 is formed on the second semiconductor material 1601, and the third semiconductor material 1508 is recessed to have the top surface substantially level with the top surface of the top first semiconductor layer 106. As shown in FIG. 16C, the fourth semiconductor material 1510 is formed on the top surface of the third semiconductor material 1508.

FIG. 16E is an enlarged cross-sectional side view of a portion 1603 of the semiconductor device structure 100 shown in FIG. 16D, in accordance with some embodiments. As shown in FIGS. 16D and 16E, the thermal annealing is performed on the semiconductor device structure 100, and dopants in the second semiconductor material 1601 are diffused into the first semiconductor layers 106 (106a, 106b, 106c) to form the doped regions 1514 (1514a, 1514b, 1514c). In some embodiments, the heat source is located over the semiconductor device structure 100, and the temperature profile decreases from the top first semiconductor layer 106c to the bottom first semiconductor layer 106a. However, due to the various thicknesses of the portions of the second semiconductor material 1601 formed on the first semiconductor layers 106a, 106b, 106c, the widths W1, W2, W3 of the doped regions 1514a, 1514b, 1514c may be substantially the same, as shown in FIG. 16E. In some embodiments, the widths W1, W2, W3 may range from about 1 nm to about 5 nm.

In some embodiments, the dopant concentration in the doped regions 1514 decreases from the end in contact with the second semiconductor material 1601 to the end in contact with the undoped region 1516.

Figure 17:
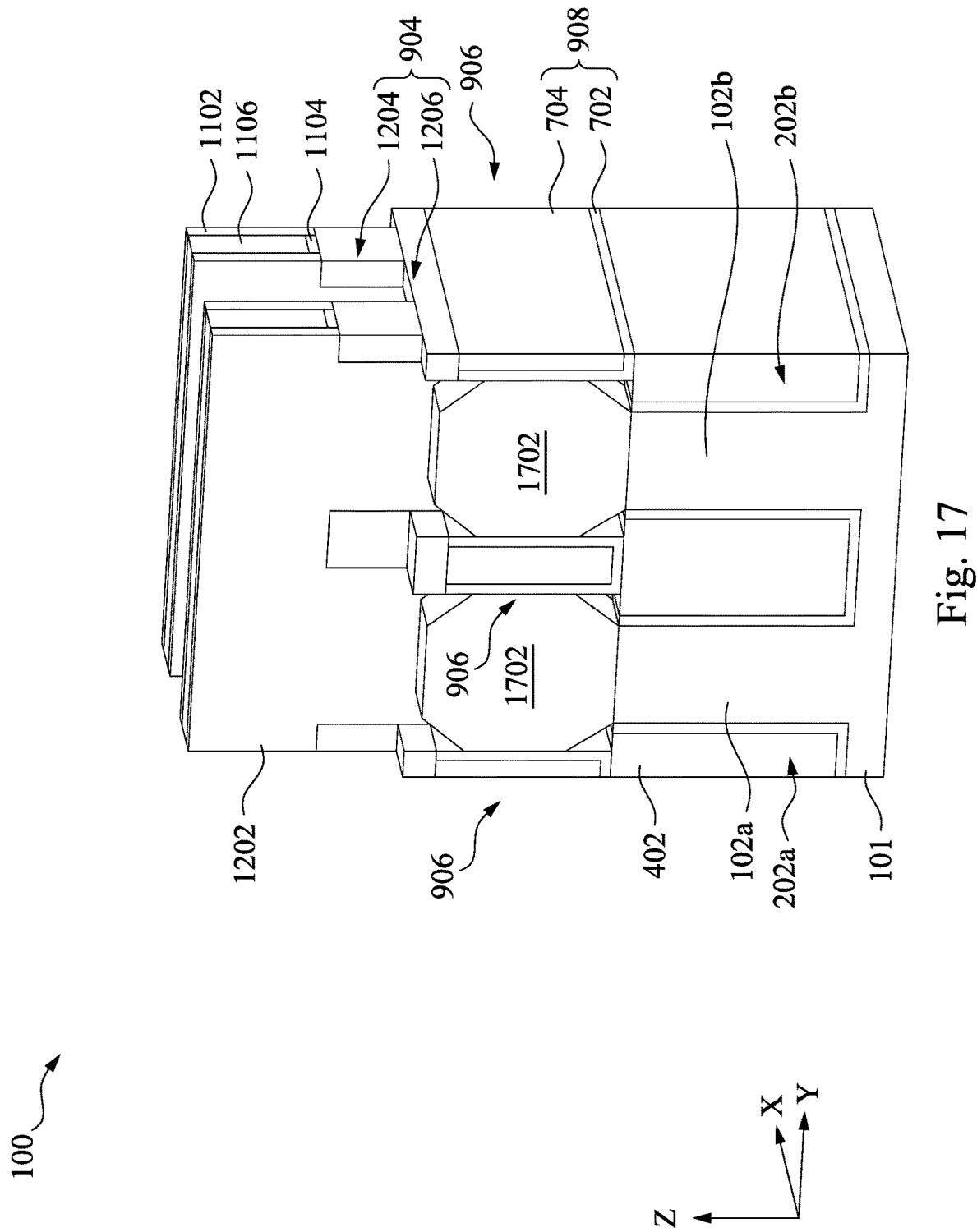
FIGS. 17 and 18 are perspective views of various stages of manufacturing the semiconductor device structure, in accordance with some embodiments.
Figure 18:
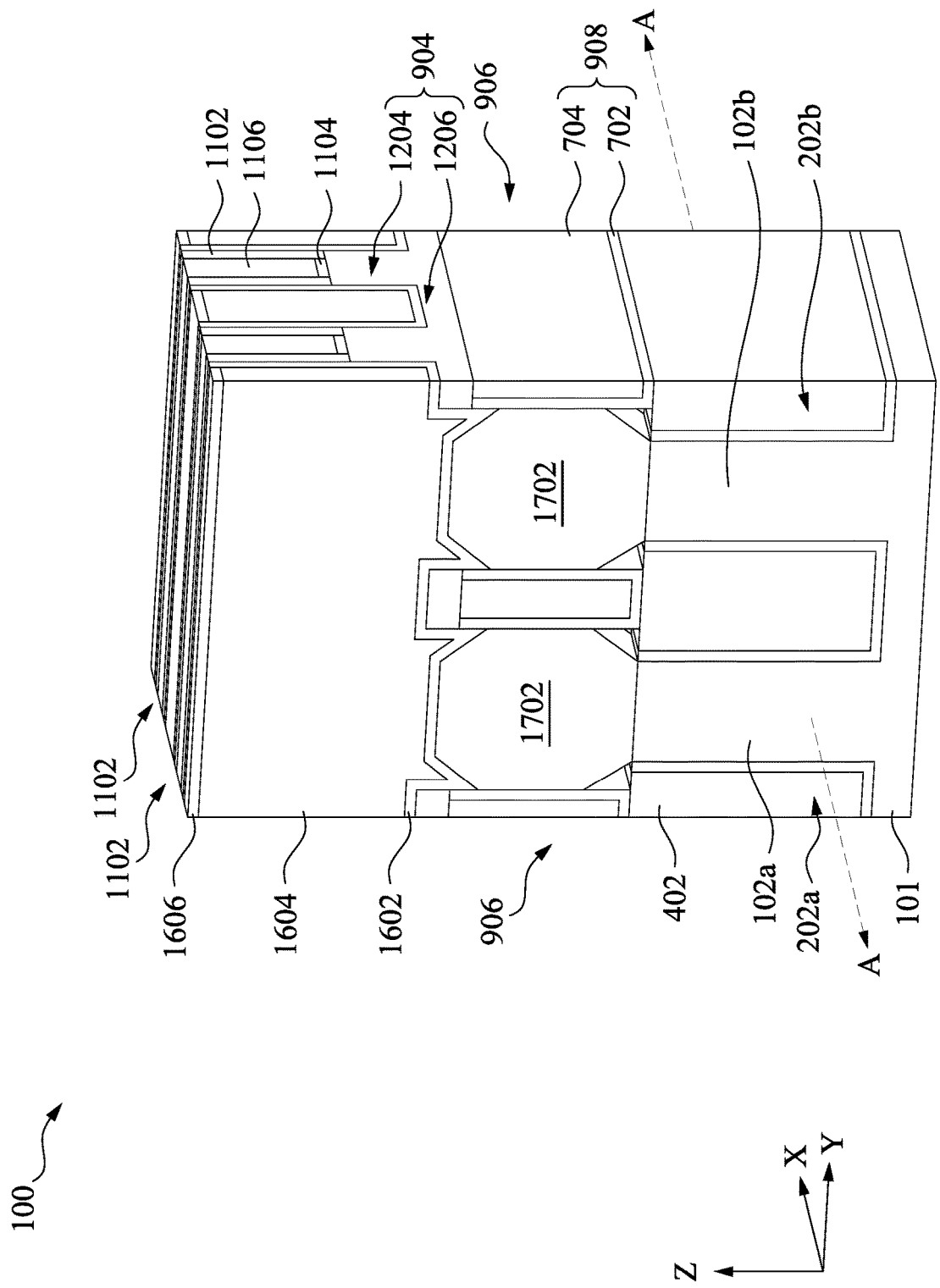

FIG. 17 is a perspective view of the semiconductor device structure 100 shown in FIG. 15F or 16D, in accordance with some embodiments. As shown in FIG. 17, the S/D epitaxial features 1702, which includes the first, second, third, and fourth semiconductor materials 1504, 1506 (or 1601), 1508, and 1510, are formed on the substrate portions 102a, 102b of the fins 202a, 202b. The S/D epitaxial features 1702 may include the doped regions 1514 (FIG. 15G). Next, as shown in FIG. 18, a contact etch stop layer (CESL) 1602 may be formed on the S/D epitaxial features 1702, the dielectric features 906, and adjacent the spacers 1202. The CESL 1602 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 1602 may be formed by CVD, PECVD, ALD, or any suitable deposition technique. In some embodiments, the CESL 1602 is a conformal layer formed by the ALD process. An interlayer dielectric (ILD) layer 1604 may be formed on the CESL 1602. The materials for the ILD layer 1604 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1604 may be deposited by a PECVD process or other suitable deposition technique. In some embodiments, after formation of the ILD layer 1604, the semiconductor device structure 100 may be subject to a thermal process to anneal the ILD layer 1604.

A planarization process is performed to expose the sacrificial gate electrode layer 1106, as shown in FIG. 18. The planarization process may be any suitable process, such as a CMP process. The planarization process removes portions of the ILD layer 1604 and the CESL 1602 disposed on the sacrificial gate stacks 1102. The planarization process may also remove the mask structure 1108 (FIG. 11). The ILD layer 1604 may be recessed to a level below the top of the sacrificial gate electrode layer 1106, and a nitrogen-containing layer 1606, such as a SiCN layer, may be formed on the recessed ILD layer 1604, as shown in FIG. 18. The nitrogen-containing layer 1606 may protect the ILD layer 1604 during subsequent etch processes.

Figure 19:
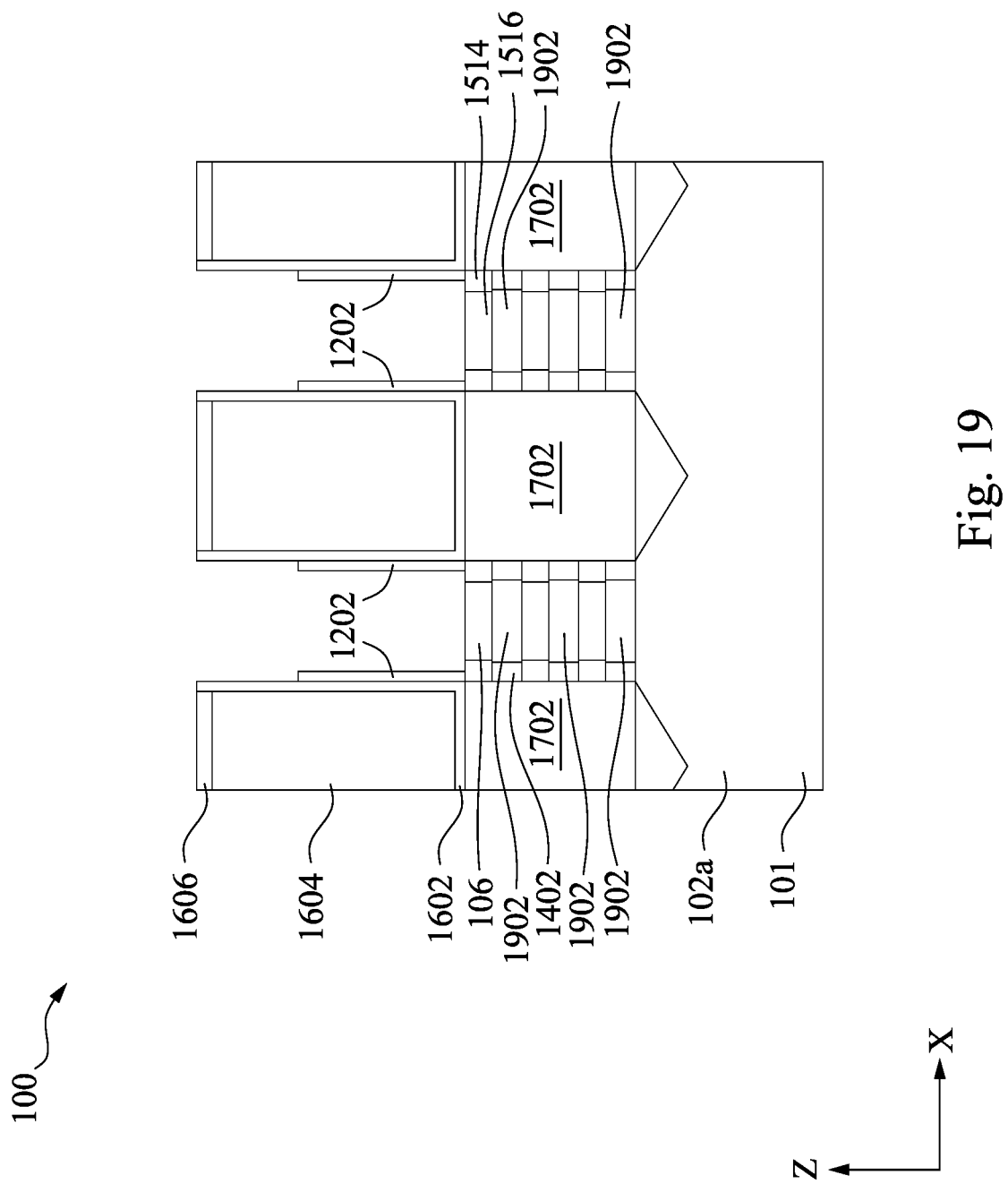
FIGS. 19 and 20 are cross-sectional side views of various stages of manufacturing the semiconductor device structure taken along line A-A of FIG. 18, in accordance with some embodiments.

FIG. 19 is a cross-sectional side view of one of the manufacturing stages of the semiconductor device structure 100 taken along line A-A of FIG. 18, in accordance with some embodiments. As shown in FIG. 19, the sacrificial gate electrode layer 1106 (FIG. 18), the sacrificial gate dielectric layer 1104, the cladding layers 602, and the second semiconductor layers 108 are removed, forming openings 1902. The sacrificial gate electrode layer 1106 may be first removed by any suitable process, such as dry etch, wet etch, or a combination thereof, followed by the removal of the sacrificial gate dielectric layer 1104, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 1106 but not the spacers 1202, the nitrogen-containing layer 1606, the dielectric material 904 of the dielectric features 906, and the CESL 1602. In some embodiments, the spacers 1202 may be recessed by the etchant used to remove the sacrificial gate electrode layer 1106 and/or the sacrificial gate dielectric layer 1104. The removal of the second semiconductor layers 108 exposes the dielectric spacers 1402 and the first semiconductor layers 106. The removal of the cladding layers 602 and the second semiconductor layers 108 may be performed by any suitable processes, such as dry etch, wet etch, or a combination thereof. The etch process may be a selective etch process that removes the cladding layers 602 and the second semiconductor layers 108 but not the spacers 1202, the CESL 1602, the nitrogen-containing layer 1606, the dielectric material 904, and the first semiconductor layers 106. As shown in FIG. 19, the undoped region 1516 of each first semiconductor layer 106 not covered by the dielectric spacers 1402 may be exposed in the openings 1902. Each undoped region 1516 of the first semiconductor layers 106 may be a nanostructure channel of the nanostructure transistor. In some embodiments, a portion of one or more doped regions 1514 may be exposed in the openings 1902.

As shown in FIG. 20, gate dielectric layers 2002 are formed in the openings 1902, and gate electrode layers 2004 are formed on the gate dielectric layers 2002. In some embodiments, an oxygen-containing layer (not shown) may be formed between the substrate portion 102a and the gate dielectric layers 2002 and between each first semiconductor layer 106 and the gate dielectric layers 2002. The gate dielectric layer 2002 may include the same material as the sacrificial gate dielectric layer 1104 (FIG. 11). In some embodiments, the gate dielectric layer 2002 includes a high-K dielectric material. The gate dielectric layers 2002 may be formed by any suitable processes, such as ALD processes. In some embodiments, the gate dielectric layers 2002 are formed by conformal processes.

The gate electrode layer 2004 is formed on the gate dielectric layer 2002 to surround a portion of each first semiconductor layer 106, such as the undoped region 1516 of each first semiconductor layer 106. The gate electrode layer 2004 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers 2004 may be formed by PVD, CVD, ALD, electro-plating, or other suitable method. In some embodiments, the gate electrode layer 2004 also surrounds a portion of the doped region 1514. Thus, the width of the gate electrode layer 2004 along the X direction may be substantially larger than the width of the undoped region 1516. As a result, the effective gate length is less than the actual gate length, leading to improved device performance.

The gate electrode layers 2004 may be recessed, as shown in FIG. 20. The recess of the gate electrode layers 2004 may be any suitable process, such as a dry etch, a wet etch, or a combination thereof. In some embodiments, the recess process may be a selective dry etch process that does not substantially affect the nitrogen-containing layer 1606, the spacer 1202, and the CESL 1602. As a result of the recess process, adjacent gate electrode layers 2004 are separated, or cut-off, by the dielectric feature 906 (FIG. 18). In some embodiments, as shown in FIG. 20, a self-aligned contact (SAC) layer 2006 is formed over the spacers 1202, the gate dielectric layer 2002, and the gate electrode layer 2004. The SAC layer 2006 may include any suitable material such as SiO, SiN, SiC, SiON, SiOC, SiCN, SiOCN, AlO, AlON, ZrO, ZrN, or combinations thereof.

Figure 21:
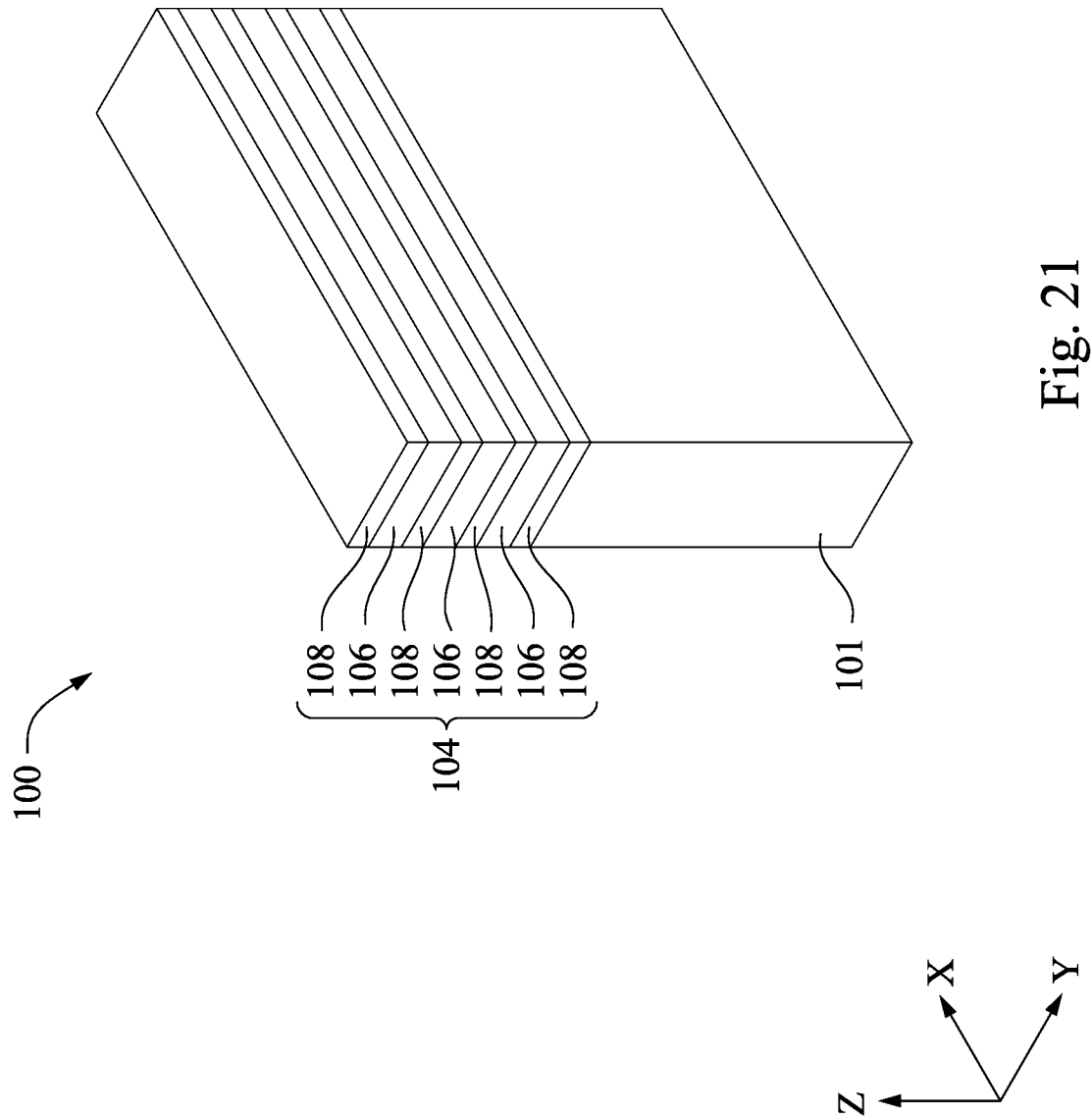
FIGS. 21-28 are perspective views of various stages of manufacturing the semiconductor device structure, in accordance with alternative embodiments.

FIGS. 21-28 are perspective views of various stages of manufacturing the semiconductor device structure 100, in accordance with alternative embodiments. As shown in FIG. 21, the stack of semiconductor layers 104 are formed on the substrate 101. As described above, any numbers of the first and second semiconductor layers 106, 108 may be included in the stack of semiconductor layers 104. As shown in FIG. 21, 3 first semiconductor layers 106 and 4 second semiconductor layers 108 are included in the stack of semiconductor layers 104, in some embodiments.

Figure 22:
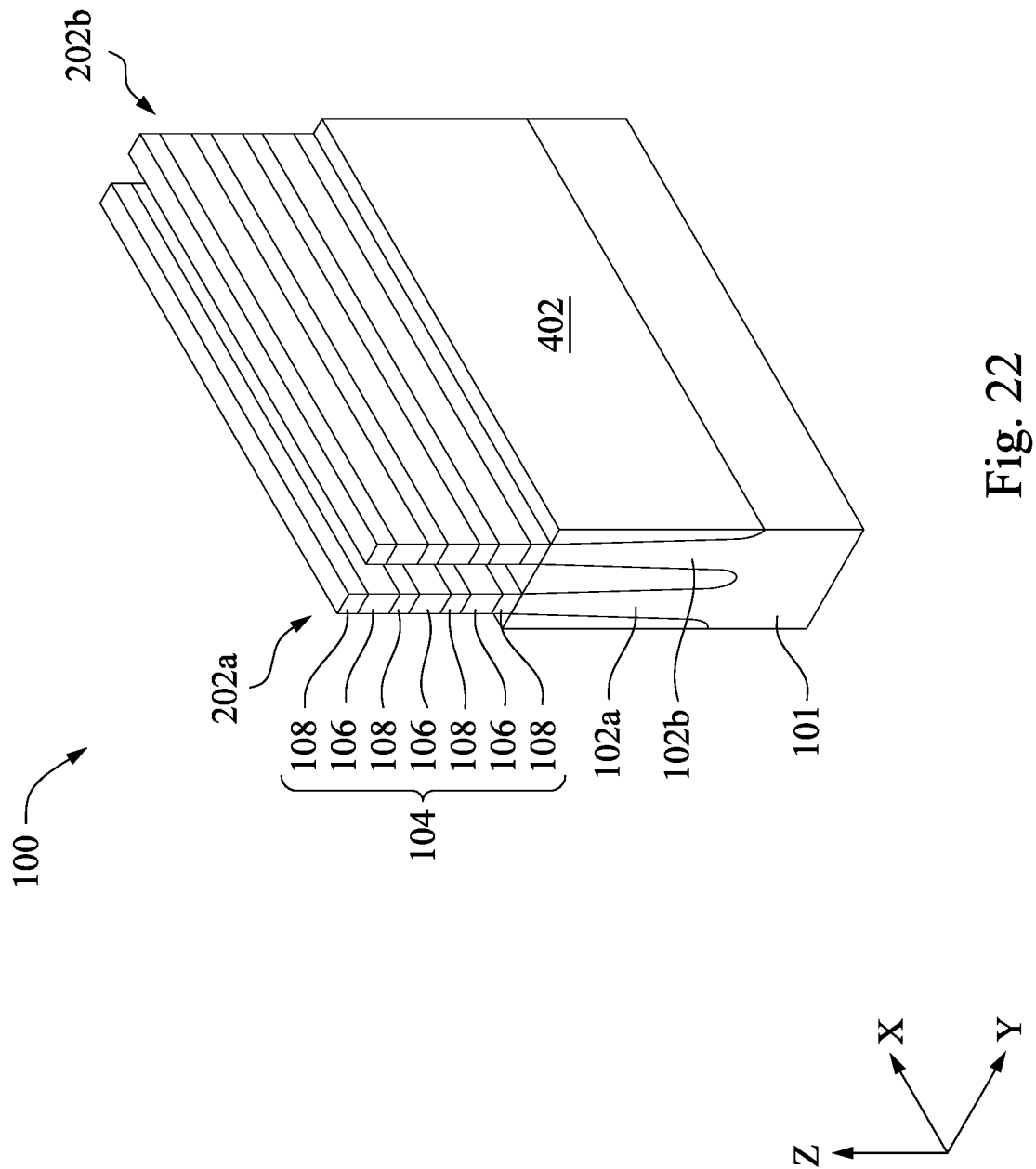
Figure 23:
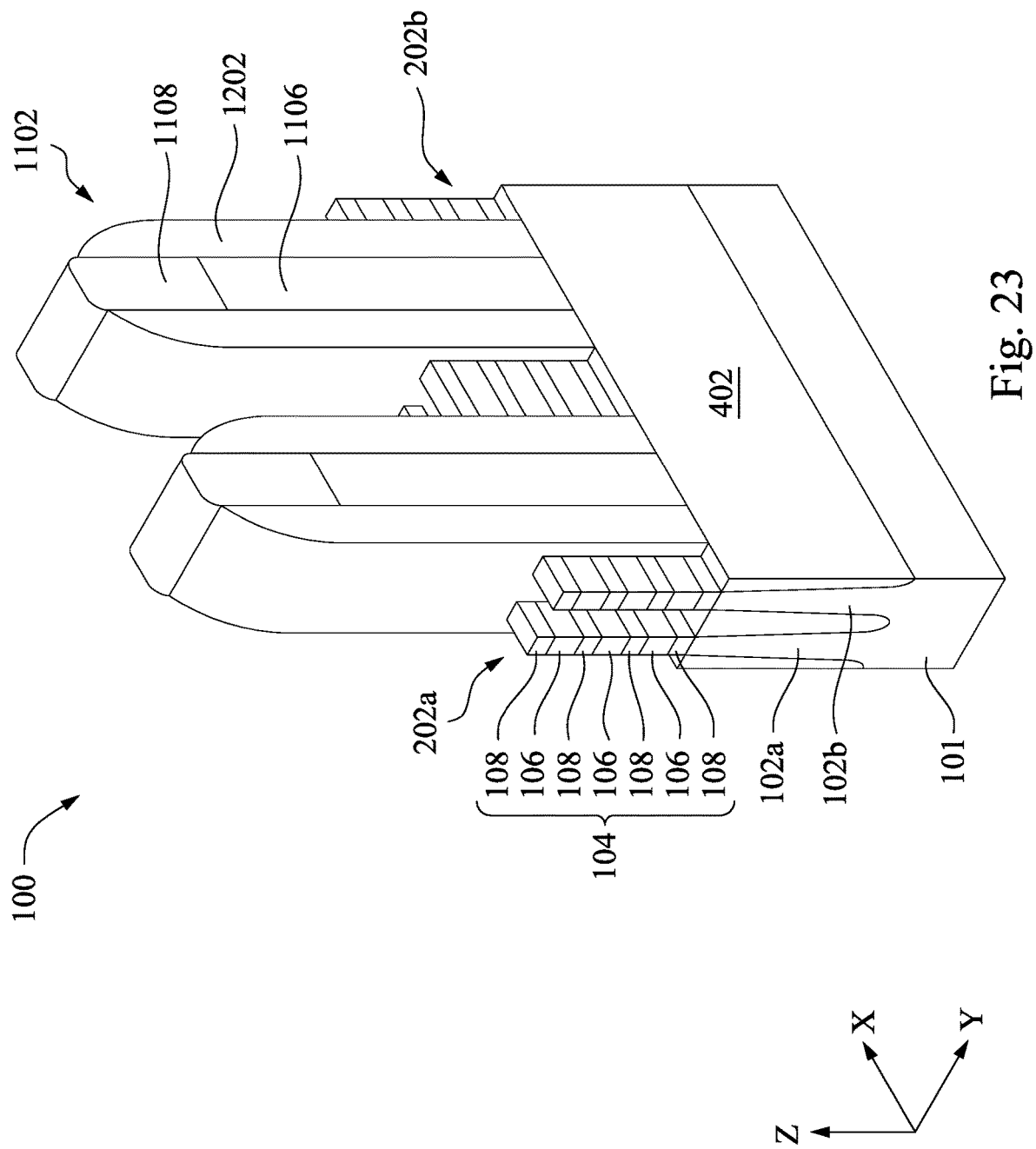

As shown in FIG. 22, the fins 202a, 202b and the insulating material 402 are formed. As shown in FIG. 23, in some embodiments, instead of forming the cladding layer 602 and the dielectric feature 906, the sacrificial gate stacks 1102 are formed over portions of the fins 202a, 202b. The sacrificial gate stack 1102 incudes the sacrificial gate electrode layer 1106 and the mask structure 1108. The spacer 1202 is formed on the sidewalls of the sacrificial gate stack 1102. The spacer 1202 and the sacrificial gate electrode layer 1106 may extend to space between adjacent fins 202a, 202b, as shown in FIG. 23.

Figure 24:
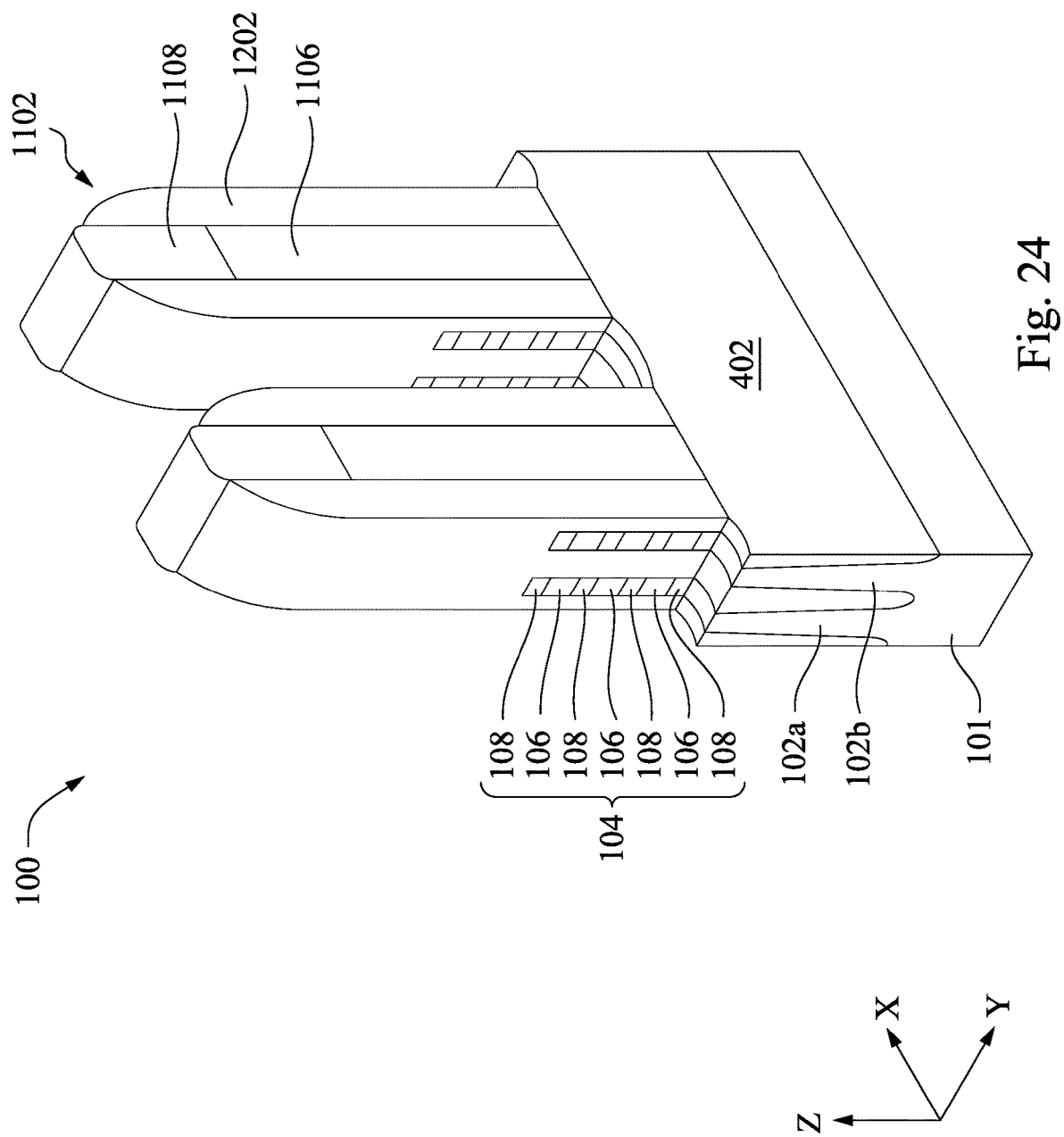

As shown in FIG. 24, exposed portions of the fins 202a, 202b are recessed. At this stage, end portions of the stacks of semiconductor layers 104 under the sacrificial gate stacks 1102 and the spacers 1202 have substantially flat surfaces which may be flush with corresponding spacers 1202. In some embodiments, the end portions of the stacks of semiconductor layers 104 under the sacrificial gate stacks 1102 and spacers 1202 are slightly horizontally etched.

Figure 25:
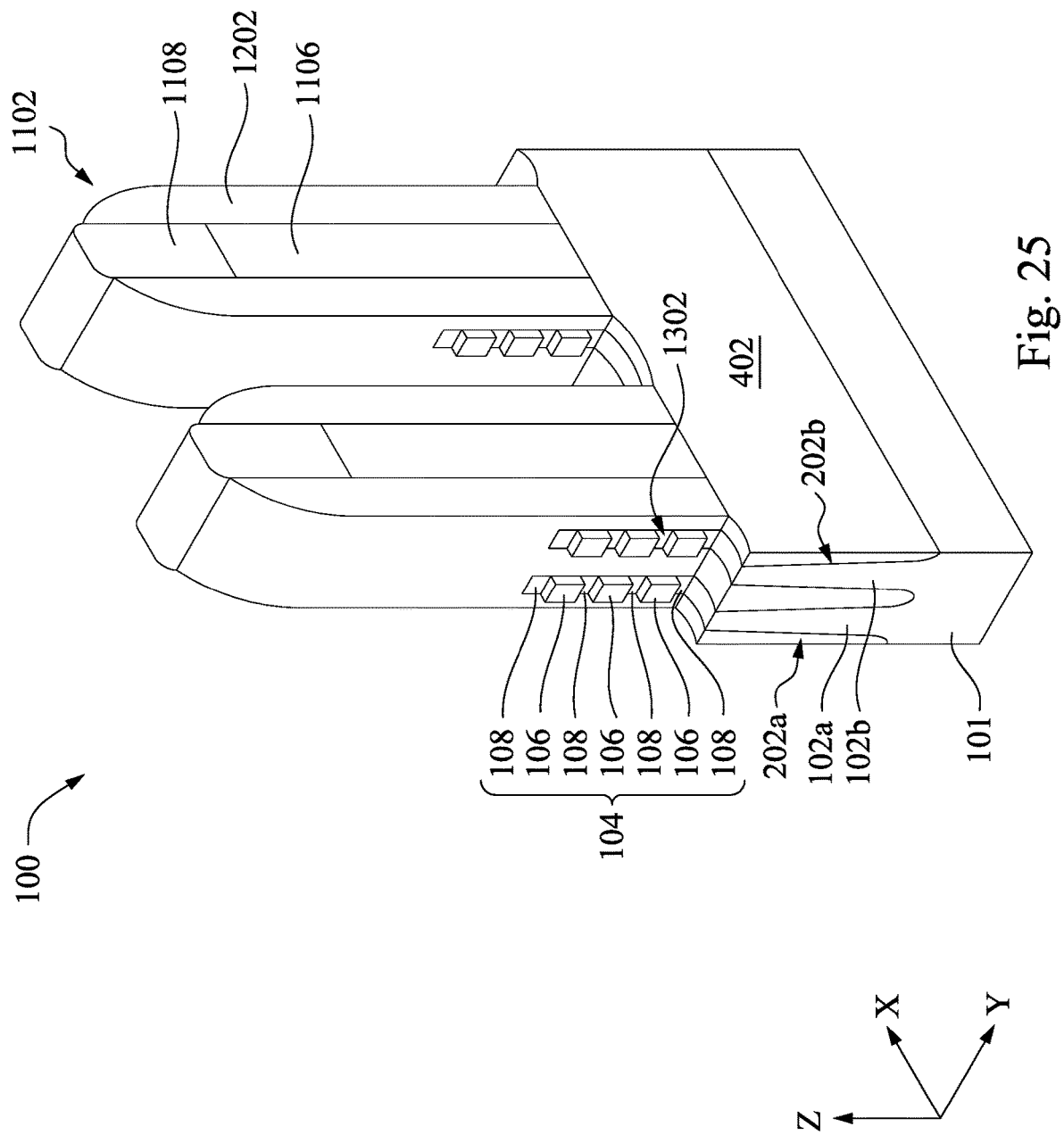
Figure 26:
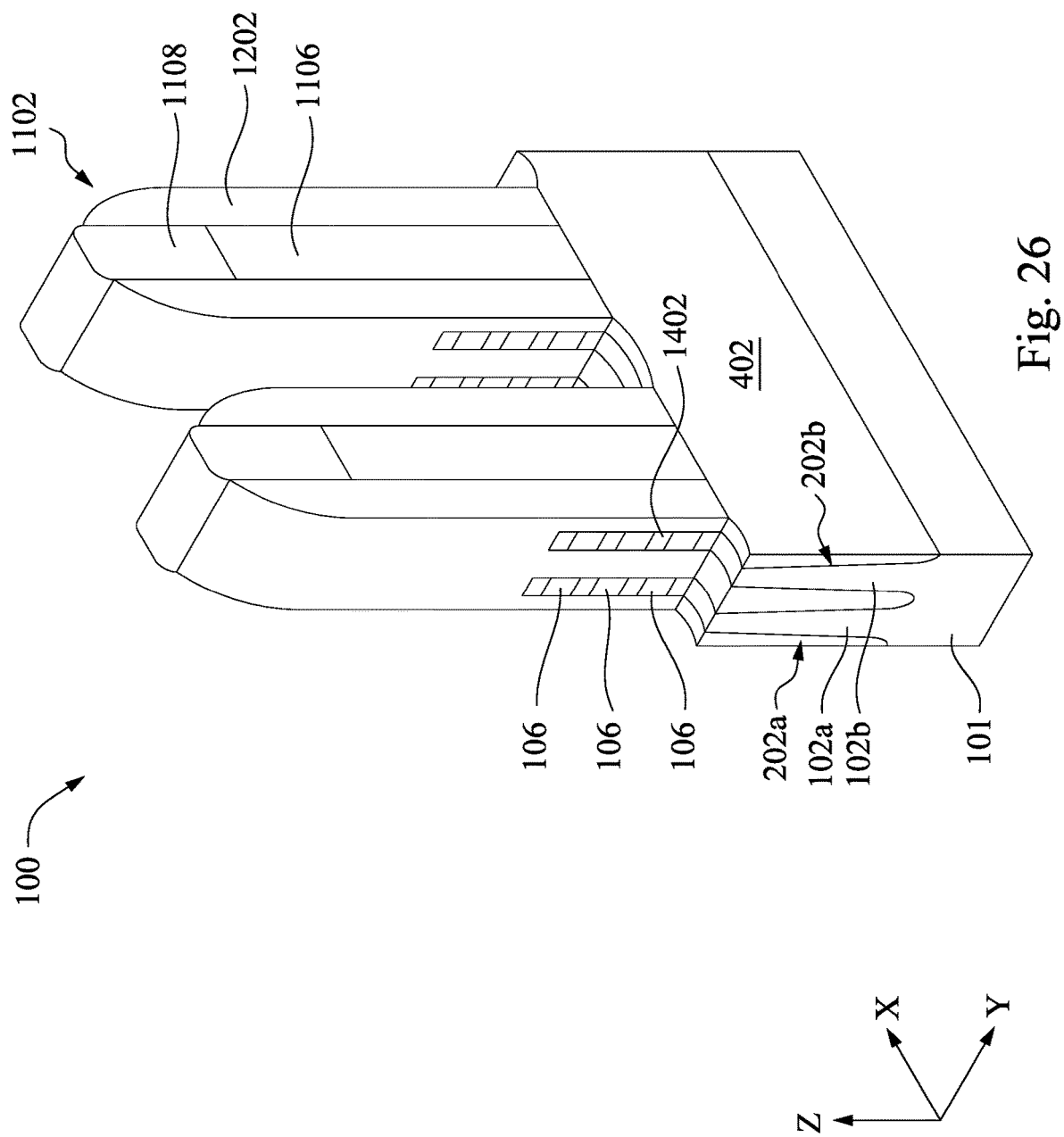
Figure 27:
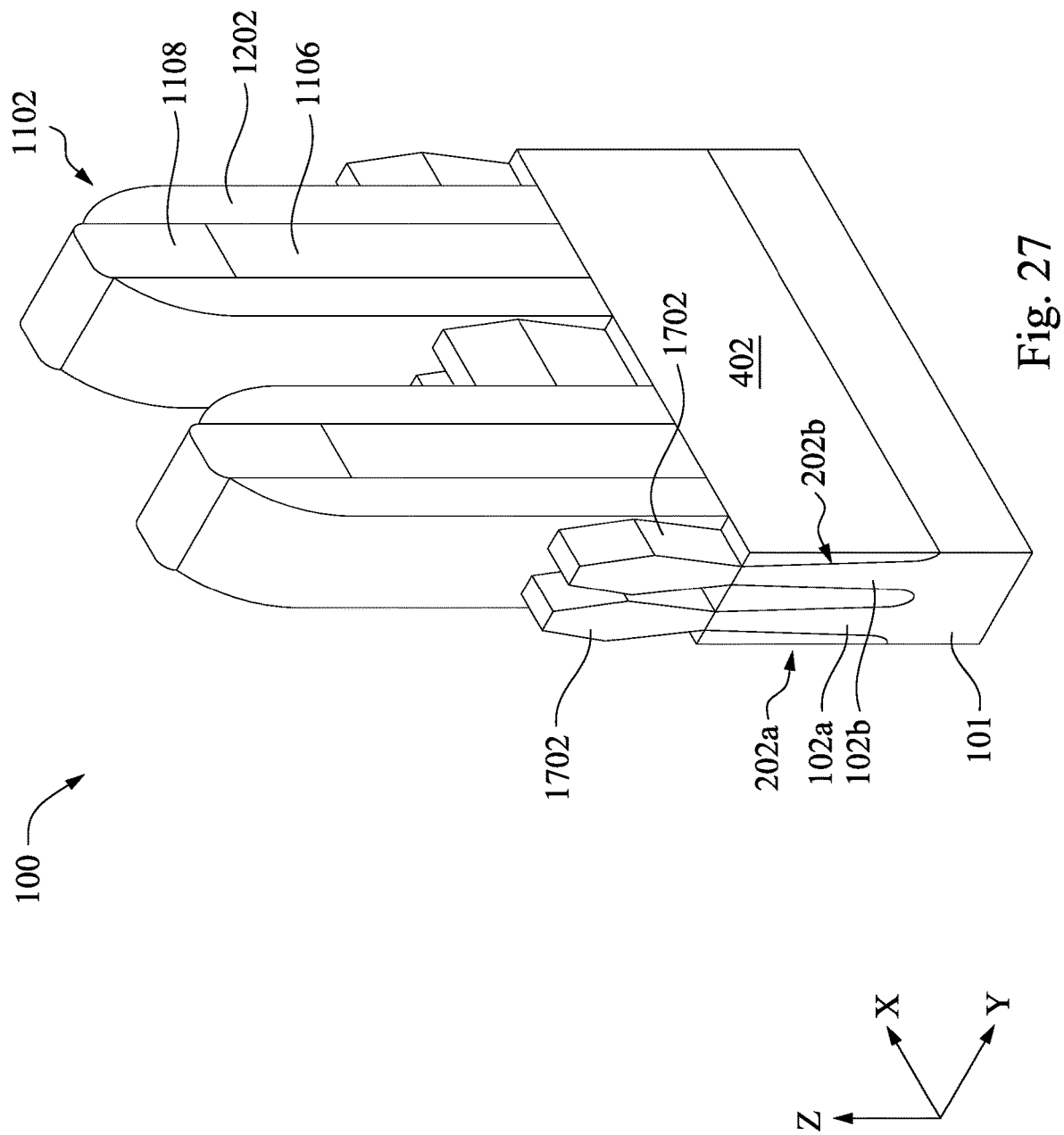
Figure 28:
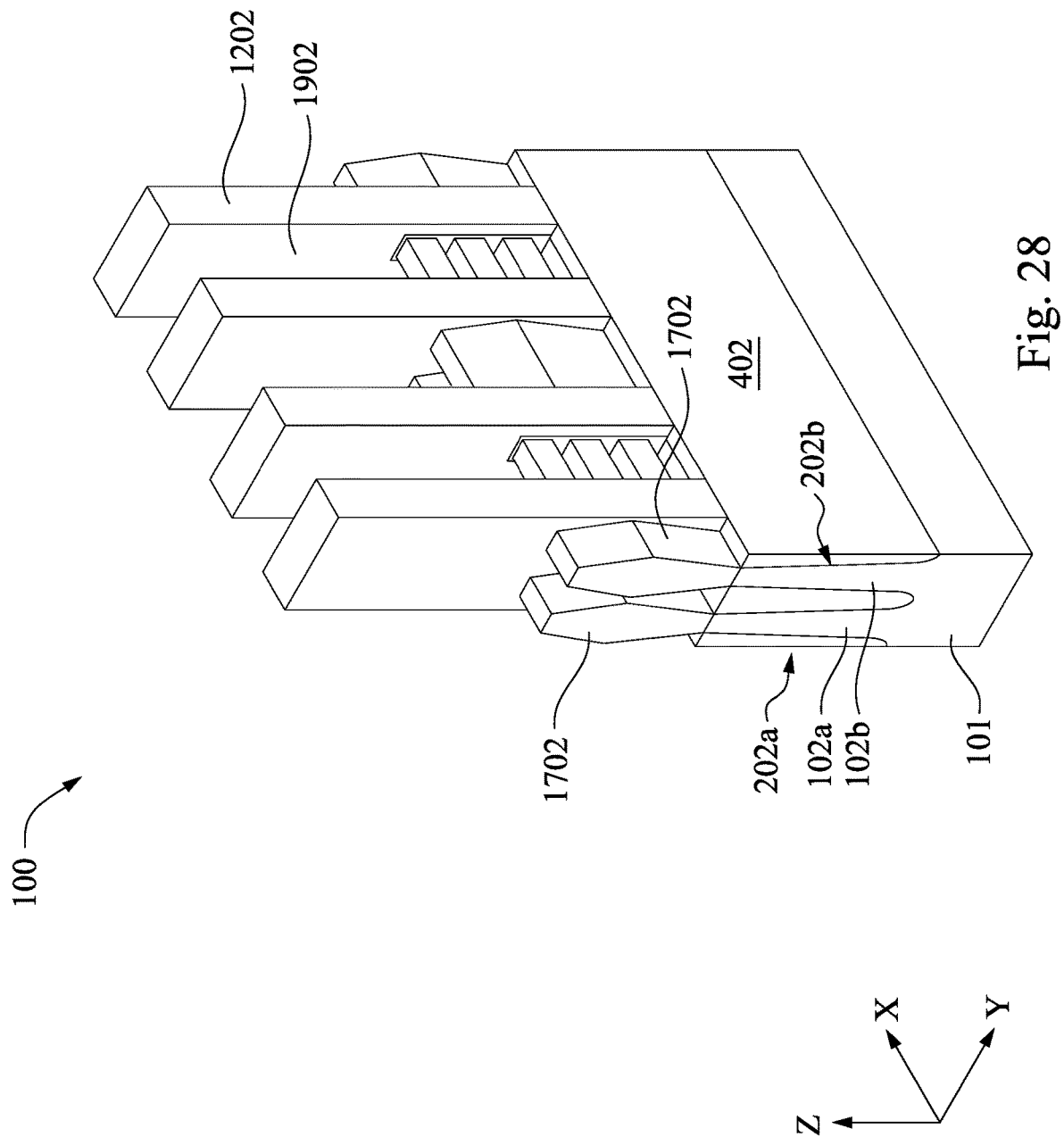

As shown in FIG. 25, the edge portions of each second semiconductor layer 108 are removed, forming gaps 1302. As shown in FIG. 26, the dielectric spacers 1402 are formed in the gaps 1302. As shown in FIG. 27, the S/D epitaxial features 1702 are formed on the substrate portions 102a, 102b. The S/D epitaxial features 1702 may be formed by the processes described in FIGS. 15C-15F or FIGS. 16A-16D. As shown in FIG. 28, the sacrificial gate stacks 1102 are removed, forming the openings 1902 to expose the first semiconductor layers 106 disposed under the sacrificial gate stacks 1102. The gate dielectric layers 2002, the gate electrode layers 2004, and the SAC layers 2006 are formed in the openings 1902 as shown in FIG. 20. The CESL layer 1602, the ILD layer 1604, and the nitrogen-containing layer 1606 are omitted in FIG. 28 for clarity.

The present disclosure provides a semiconductor device structure 100 including vertically stacked first semiconductor layers 106, and each first semiconductor layer 106 has two doped regions 1514 and an undoped region 1516 disposed between the two doped regions 1514. The doped regions 1514 function as extended S/D regions. Some embodiments may achieve advantages. For example, the extended S/D regions reduce channel resistance of the device, improve Ideff-Isof gain, improve DIBL, and reduce contact resistance of the S/D regions.

An embodiment is a semiconductor device structure. The semiconductor device structure includes a source/drain epitaxial feature having a first semiconductor material, a first semiconductor layer having a first doped region and a first undoped region adjacent the first doped region, and the first doped region is in contact with the first semiconductor material. The structure further includes a second semiconductor layer disposed over the first semiconductor layer, and the second semiconductor layer includes a second doped region and a second undoped region adjacent the second doped region. The second doped region is in contact with the first semiconductor material. The structure further includes a gate electrode layer surrounding at least the first undoped region and the second undoped region.

Another embodiment is a semiconductor device structure. The semiconductor device structure includes a source/drain epitaxial feature, a first channel in contact with the source/drain epitaxial feature, and the first channel has a first width. The structure further includes a second channel disposed over the first channel, the second channel is in contact with the source/drain epitaxial feature, and the second channel has a second width substantially less than the first width. The structure further includes a gate electrode layer surrounding at least the first and second channels.

A further embodiment is a method. The method includes forming a stack of first and second semiconductor layers, forming a sacrificial gate stack over a portion of the stack of first and second semiconductor layers, removing exposed portions of the stack of first and second semiconductor layers to expose a substrate portion, forming a first semiconductor material over the substrate portion and in contact with the first semiconductor layers, heating the first semiconductor material and the first semiconductor layers to a temperature ranging from about 800 degrees Celsius to about 1000 degrees Celsius, removing the sacrificial gate stack, removing the second semiconductor layers, and forming a gate electrode layer surrounding at least a portion of each first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a source/drain epitaxial feature comprising a semiconductor material including a first portion having a first thickness, a second portion having a second thickness different from the first thickness, and a third portion having a third thickness;
   a first semiconductor layer comprising a first doped region and a first undoped region adjacent the first doped region, wherein the first doped region is in contact with the first portion of the semiconductor material;
   a second semiconductor layer disposed over the first semiconductor layer, wherein the second semiconductor layer comprises a second doped region and a second undoped region adjacent the second doped region, and the second doped region is in contact with the second portion of the semiconductor material; and
   a gate electrode layer surrounding at least the first undoped region and the second undoped region.

2. The semiconductor device structure of claim 1, wherein the semiconductor material is doped with a dopant, and the first and second doped regions are doped with the dopant.

3. The semiconductor device structure of claim 2, wherein the dopant is an n-type dopant or a p-type dopant, and a dopant concentration of the first doped region decreases from a first end in contact with the first portion of the semiconductor material to a second end in contact with the first undoped region.

4. The semiconductor device structure of claim 1, wherein the first doped region has a first width, and the second doped region has a second width substantially the same as the first width.

5. The semiconductor device structure of claim 4, wherein the first thickness of the first portion of the semiconductor material is substantially greater than the second thickness of the second portion of the semiconductor material.

6. The semiconductor device structure of claim 1, further comprising a third semiconductor layer disposed over the second semiconductor layer, wherein the third semiconductor layer comprises a third doped region and a third undoped region adjacent the third doped region.

7. The semiconductor device structure of claim 6, wherein the third doped region is in contact with the third portion of the semiconductor material.

8. The semiconductor device structure of claim 7, wherein the third thickness is substantially less than the second thickness, which is substantially less than the first thickness.

9. A semiconductor device structure, comprising:
   a source/drain epitaxial feature comprising a semiconductor material;
   a first semiconductor layer comprising a first channel region and a first extended source/drain region, wherein the first extended source/drain region is distinct from the source/drain epitaxial feature, wherein the first extended source/drain region is disposed between the first channel region and the semiconductor material, and the first extended source/drain region has a first width; and
   a second semiconductor layer disposed over the first semiconductor layer, wherein the second semiconductor layer comprises a second channel region and a second extended source/drain region, the second extended source/drain region is disposed between the second channel region and the semiconductor material, and the second extended source/drain region has a second width different from the first width.

10. The semiconductor device structure of claim 9, wherein the semiconductor material comprises a first portion in contact with the first extended source/drain region and a second portion in contact with the second extended source/drain region.

11. The semiconductor device structure of claim 10, wherein the first portion of the semiconductor material has a first thickness, and the second portion of the semiconductor material has a second thickness substantially the same as the first thickness.

12. The semiconductor device structure of claim 11, further comprises a third semiconductor layer disposed over the second semiconductor layer, wherein the third semiconductor layer comprises a third channel region and a third extended source/drain region.

13. The semiconductor device structure of claim 12, wherein the third extended source/drain region has a third width different from the first and second widths.

14. The semiconductor device structure of claim 13, wherein the third width is substantially greater than the second width, which is substantially greater than the first width.

15. The semiconductor device structure of claim 14, wherein the semiconductor material further comprises a third portion in contact with the third extended source/drain region.

16. The semiconductor device structure of claim 15, wherein the third portion of the semiconductor material has a third thickness substantially the same as the second thickness.

17. A method, comprising:
   forming a fin comprising a first semiconductor layer, a second semiconductor layer disposed over the first semiconductor layer, and a third semiconductor layer disposed over the second semiconductor layer;
   removing portions of the fin to expose a substrate portion;
   depositing a first semiconductor material over the substrate portion, wherein the first semiconductor material has a first portion in contact with the first semiconductor layer, a second portion in contact with the second semiconductor layer, and a third portion in contact with the third semiconductor layer, the first portion has a first thickness, the second portion has a second thickness different from the first thickness, and the third portion has a third thickness;

heating the first semiconductor material and the first, second, and third semiconductor layers to a temperature ranging from about 800 degrees Celsius to about 1000 degrees Celsius; and forming a gate electrode layer surrounding at least a portion of each of the first, second, and third semiconductor layer.

18. The method of claim 17, further comprising:

forming a second semiconductor material on the first semiconductor material; and forming a third semiconductor material on the second semiconductor material.

19. The method of claim 18, further comprising driving a dopant from the first semiconductor material into the first, second, and third semiconductor layers to form a first doped region in the first semiconductor layer, a second doped region in the second semiconductor layer, and a third doped region in the third semiconductor layer.

20. The method of claim 19, wherein the first doped region, the second doped region, and the third doped region have substantially the same width.

\* \* \* \* \*